US011069424B2

United States Patent
Chhabra et al.

(10) Patent No.: US 11,069,424 B2
(45) Date of Patent: Jul. 20, 2021

(54) SENSOR FOR PERFORMANCE VARIATION OF MEMORY READ AND WRITE CHARACTERISTICS

(71) Applicant: Arm Limited, Cambridge (GB)

(72) Inventors: Amit Chhabra, Noida (IN); Rainer Herberholz, Great Abington (GB)

(73) Assignee: Arm Limited, Cambridge (GB)

( * ) Notice: Subject to any disclaimer, the term of this patent is extended or adjusted under 35 U.S.C. 154(b) by 71 days.

(21) Appl. No.: 16/183,660

(22) Filed: Nov. 7, 2018

(65) Prior Publication Data

US 2020/0143901 A1    May 7, 2020

(51) Int. Cl.
| | |
|---|---|
| *G11C 11/00* | (2006.01) |
| *G11C 29/50* | (2006.01) |
| *G11C 11/412* | (2006.01) |
| *G11C 11/419* | (2006.01) |

(52) U.S. Cl.
CPC ............ *G11C 29/50* (2013.01); *G11C 11/412* (2013.01); *G11C 11/419* (2013.01); *G11C 29/50012* (2013.01); *G11C 2029/5002* (2013.01); *G11C 2029/5004* (2013.01)

(58) Field of Classification Search
CPC .... E04B 1/585; E04D 13/064; E04D 13/0722
USPC ........................................................ 156/156
See application file for complete search history.

(56) References Cited

U.S. PATENT DOCUMENTS

| | | | | |
|---|---|---|---|---|
| 8,330,478 | B2 | 12/2012 | Myers et al. | |
| 2015/0269982 | A1* | 9/2015 | Chandra | G11C 7/22 365/194 |
| 2015/0318056 | A1* | 11/2015 | Ghosh | G11C 29/50012 365/154 |
| 2018/0233193 | A1* | 8/2018 | Kumar | G11C 29/26 |

OTHER PUBLICATIONS

Arm Limited; PCT / GB2018 / 052771; filed Sep. 28, 2018.
Sandhu, et al.; U.S. Appl. No. 15/691,722, filed Aug. 30, 2017.
Tsai, et al.; SRAM Stability Characterization Using Tunable Ring Oscillators in 45nm CMOS; ISSCC 2010; Feb. 10, 2010.
Hot Chips 2003—Intelligent Energy Management: An SoC design based on ARM926EJ-S; Arm Slideshow Presentation; 2003.

\* cited by examiner

*Primary Examiner* — Hoai V Ho
*Assistant Examiner* — Minh Dinh
(74) *Attorney, Agent, or Firm* — Pramudji Law Group PLLC; Ari Pramudji

(57) ABSTRACT

Various implementations described herein refer to an integrated circuit having a first memory structure and a second memory structure. The first memory structure is disposed in a first area of the integrated circuit, and the first memory structure has first memory cells with first transistors. The second memory structure is disposed in a second area of the integrated circuit that is different than the first area, and the second memory structure has second memory cells with second transistors that are separate from the first transistors. The second transistors of the second memory cells are arranged to provide an output oscillating frequency for detecting variation of performance of the first transistors of the first memory cells.

23 Claims, 13 Drawing Sheets

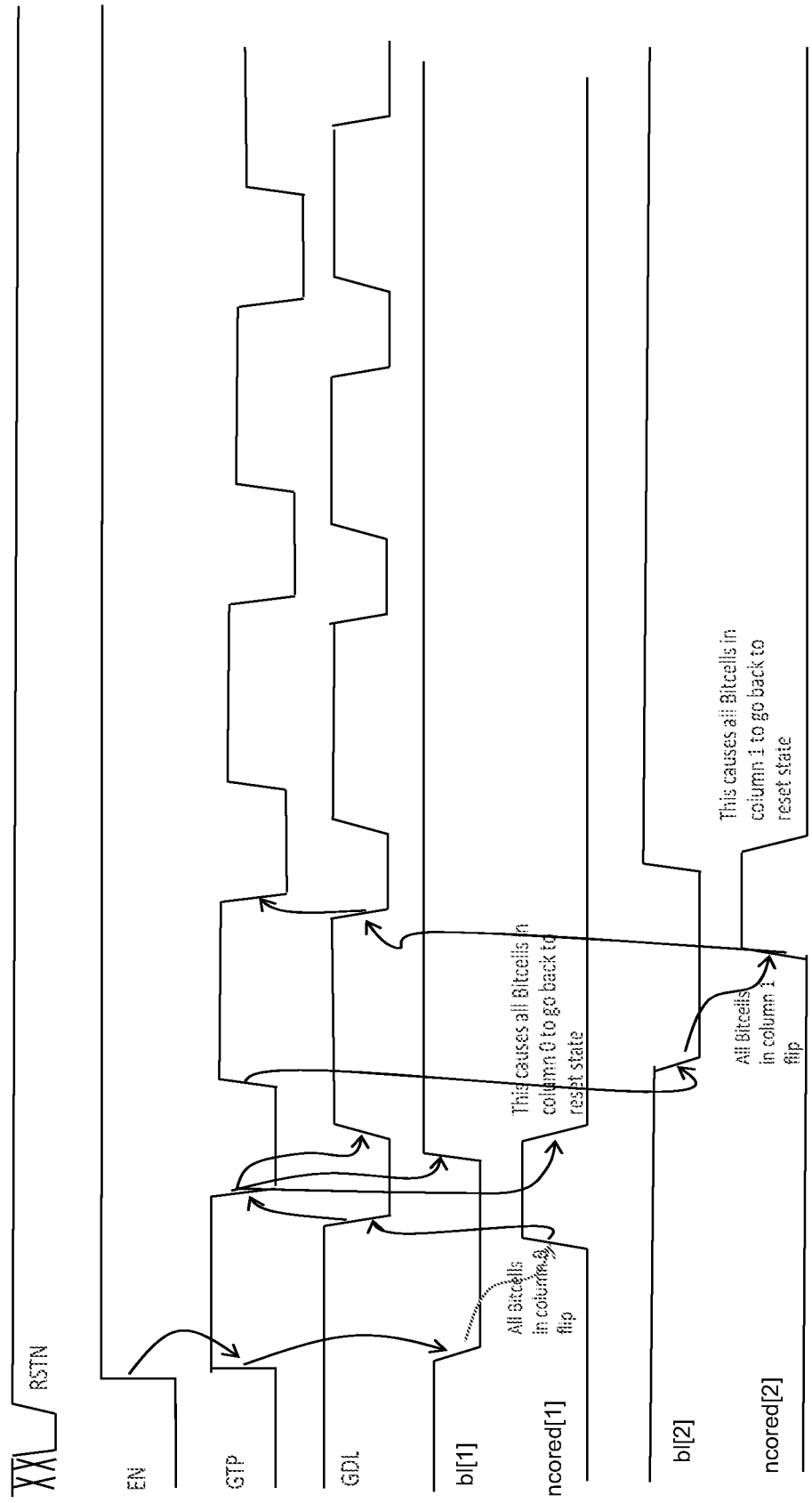

SENSOR FOR PERFORMANCE VARIATION OF MEMORY READ AND WRITE CHARACTERISTICS

CROSS-REFERENCE TO RELATED APPLICATION

This non-provisional patent application is related to non-provisional patent application number U.S. Pat. No. 16/183,655 filed 2018 Nov. 7, now U.S. Pat. No. 10,964,379, and titled "RING OSCILLATOR BASED BITCELL DELAY MONITOR", which is incorporated herein by reference in its entirety.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, an integrated circuit (IC) having components of a computing system provided on a single chip typically refers to system on a chip (SoC). The SoC is fabricated to include digital, analog, mixed-signal, and/or radio-frequency (RF) capability on a single chip substrate. SoC applications are useful for mobile electronic devices due to their low power consumption and minimal area impact in embedded systems. Some applications involving an SOC may include embedded memory, such as, e.g., static random access memory (SRAM).

The performance of an SoC may be limited by process variation resulting in high transistor delays and or high interconnect delays at extreme temperature conditions (low temperatures, e.g., −40° C., or high temperatures, e.g., 125° C.). Generally, the lowest voltage for performance sign-off is 10% below a typical voltage combined with worst-case temperature and process variation. As such, timing closure at a slowest point, which may occur infrequently and for few semiconductor dies, limits the ability to reduce the power consumption of electronic systems.

Transistor switching delays depend on the voltage overdrive at the transistor gate, i.e. the difference between the voltage threshold (Vth) and the supply voltage (VDD). Sometimes, static memory (e.g., static random access memory (SRAM)) may be substantially affected, since it may have high voltage threshold (Vth) devices (due to requirements for low leakage). There is a global process variation, which refers to the average characteristics of a large number of similar structures, which are used within close proximity on a single semiconductor die, thus averaging the differences between individual cells due to purely statistical variation of the local properties. Also, since a bit-count on the SoC may be too high (running to multi-mega bits), local variations in static memory design may need to be accounted for. Therefore, a difference between operating voltage (VDD) and the Vth of the worst case static memory device may be substantially low. When the variation across the process, temperature and voltage is considered, the voltage overdrive at the transistor gate varies from a very small value (in case of high Vth) to very large values (in case of low Vth) Thus, there may be a need to keep a lot of margin for qualifying the static memory functionality, and further, in some instances, power may be adversely affected at typical operating conditions.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 3A, 3B-1, 3B-2, 3C-1 and 3C-2 illustrate diagrams of memory circuitry having an array of bitcells adapted for sensing global characteristics in accordance with various implementations described herein.

DETAILED DESCRIPTION

Figure 1A:
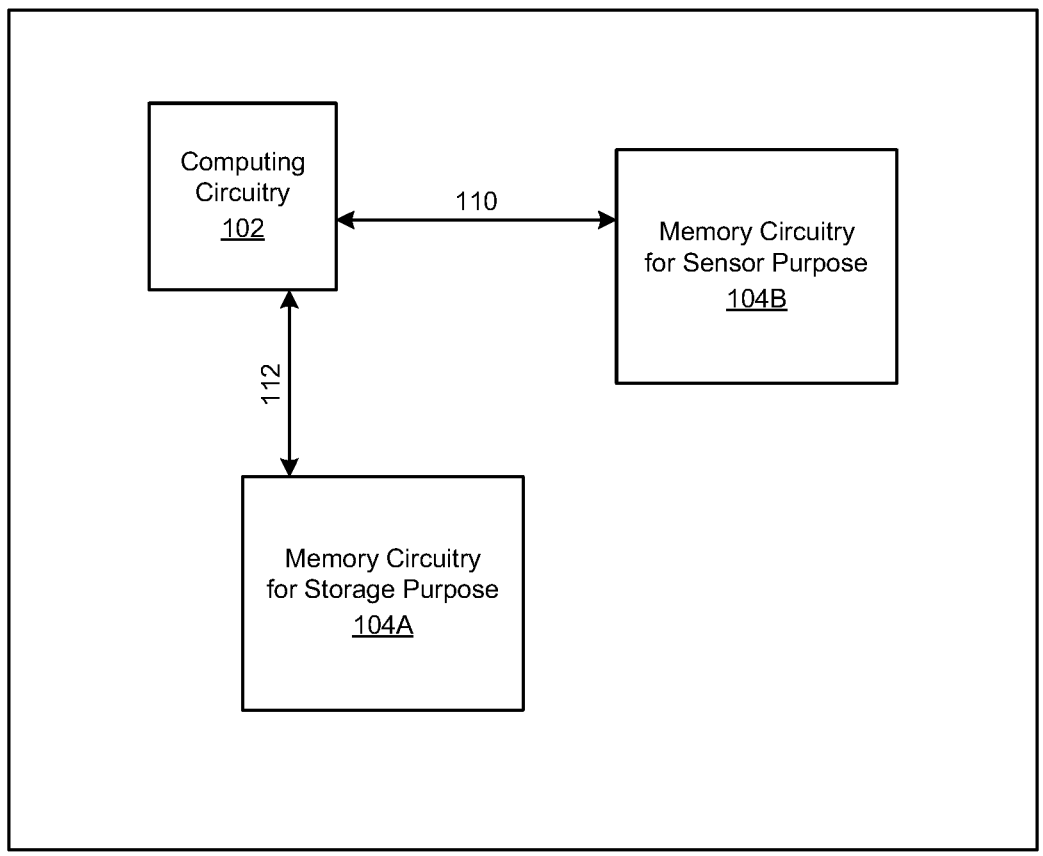
FIGS. 1A-1C illustrate various diagrams of memory devices that are adapted for sensing global characteristics in accordance with various implementations described herein.

Various implementations described herein are directed to a performance variation sensor that may be implemented with an array of memory cells. The sensor responds to the combined impact of operating conditions. Schemes and techniques described herein provide for an output signal with repetitive switching similar to a clock, such that the frequency may be strongly correlated to either read performance or write performance of the memory cell based on transistor properties of the memory cell. In this instance, one edge of the output signal switches in relation to a wordline becoming active and activating a read or write of the memory cell while the other edge of the output signal switches in relation to a restore function of the wordline and associated bitlines. The restore function may be enabled by bitline discharge in a read operation or by detecting a successful write operation. The memory performance monitor, timing performance sensor, or test structure may be configured as an oscillator (or oscillator like) to provide an oscillating output signal, with possibly some jitter associated with variation within different memory cells. The performance of process, voltage, and temperature, i.e., PVT, may be determined as normal for an oscillator by measuring frequency or using a counter to determine a number of oscillations over a sampling period with reference to an on-chip clock. The schemes and techniques described herein may be achieved by a single static memory array.

In some implementations, there may be a separate timing output depending on whether a read performance is measured or a write performance is measured. In some implementations, there may be an array of bitcells configured in a matrix formation similar to the memory instance. The aspect ratio is defined as the ratio of the number of rows of the bitcell to the number of columns of the bitcell in the array arrangement. The array aspect ratio of an array of bitcells may be different for a read performance than a write performance. In some instances, as described herein below, two physical bitcell arrays may be implemented and used with one array to generate an output for read performance and another one array to generate another output for write performance. The write performance may occur by writing through one of the bitlines in a bitline pair and observing the output change on an alternate bitline, wherein the same value may be stored in each bitcell. If there are two separate bitcell arrays (one bitcell array for read and one bitcell array for write), then the read array is only written once, and then the same data stored in each memory cell is read out while the wordline is active, and then the bitlines are restored back to the pre-read state. In the situation of a write array, there is a common data value that is stored in the memory cell. As the memory cell is written to an opposite state (through the one bitline), the complement bitline may switch states so as to indicate when the memory cell write has occurred and an internal node has changed state. After the write occurs and the output is switched, the memory cell may be written back to its original state, and as this occurs, the output may switch. In addition, the memory cell may be written back to its original state.

The schemes and techniques described herein are adapted to minimize area of the test structure, as it may be useful to serve as a performance monitor or evaluation of performance, including the process, voltage, and temperature (PVT) of a design. This memory monitor may support variable voltages on the VLSI product design allowing for either higher operating voltage and thus higher performance and power or lower operating voltage, with resulting lowering of performance and power. In some implementations, there may be a particular sequence of wordlines that may be activated per design such that the output signal follows a regular pattern. The schemes and techniques described herein may be modified if necessary, or a random number generator may be used to select a sequence of memory cells, which may cause the test structure to be larger. In some instances, the sequence of wordlines may be pre-determined or designed in so as to minimize area and thus eliminate (or at least inhibit) a need for a row decoder and/or a column decoder. As such, in some cases, the memory circuitry or structure may have a pre-determined read order of the bits through the array, and thus, the bits may not be read randomly.

Although the preferred embodiment is to reduce or eliminate the area of a row or column decoder in order to provide a particular sequence that is not random, it is still possible to include decoders within the performance sensor to achieve an oscillating output that is a performance indicator of read or write performance. Having a decoder would add additional area, however, it is still possible to achieve the oscillating output. The address sequence may be fed from an outside controller. The outside controller may be a memory built in self-test functional unit. The address sequence may also be scanned into a set of registers that would feed the address sequence to the performance sensor. The outside controller may also feed an address sequence which appears to be random but is controlled through some sort of random number generator in the outside controller. Therefore, although a preferred embodiment might specify that the performance monitor may be created without decoders, it is still possible to follow the principles of the performance monitor even if decoders are included.

Various implementations described herein refer to a scheme for Adaptive Voltage Scaling (AVS) or Adaptive Margin Scaling (AMS) that includes a memory monitor (e.g., SRAM monitor) to detect read and write delays and then to adjust supply voltage and/or programmable settings of the memory instances. In some instances, programmable settings may refer to providing a computer (or some other machine) with coded instructions for an automatic performance of a task, and sometimes, at process level, no programming is typically done. In other instances, a supply voltage (VDD) or settings for internal timing margins or read/write assist may be changed for a memory structure so as to cause a change in at least one of performance and power. Generally, the memory monitor provides a frequency that is a function of static memory speed, and this frequency may be converted to a code that a system controller may read and adjust the voltage. For instance, if the properties of static memory devices are skewed to slow process, and the voltage is low, and the temperature is cold, the static memory delay monitor may produce a code which has a low value, and the voltage may be increased. The static memory monitor may generate a greater value of the code due to increased voltage. In this instance, the supply voltage may be adjusted to ensure that the static memory monitor is providing a code within specified bounds for the margin and read/write assist settings of the memory instance. Alternatively, the controller may adapt settings for memory internal timing margins or assist settings for read and write operation, to ensure proper functionality of the memory.

Various implementations of sensing performance variation for memory applications will now be described in greater detail herein with reference to FIGS. 1A-3C-1.

Figure 1B:
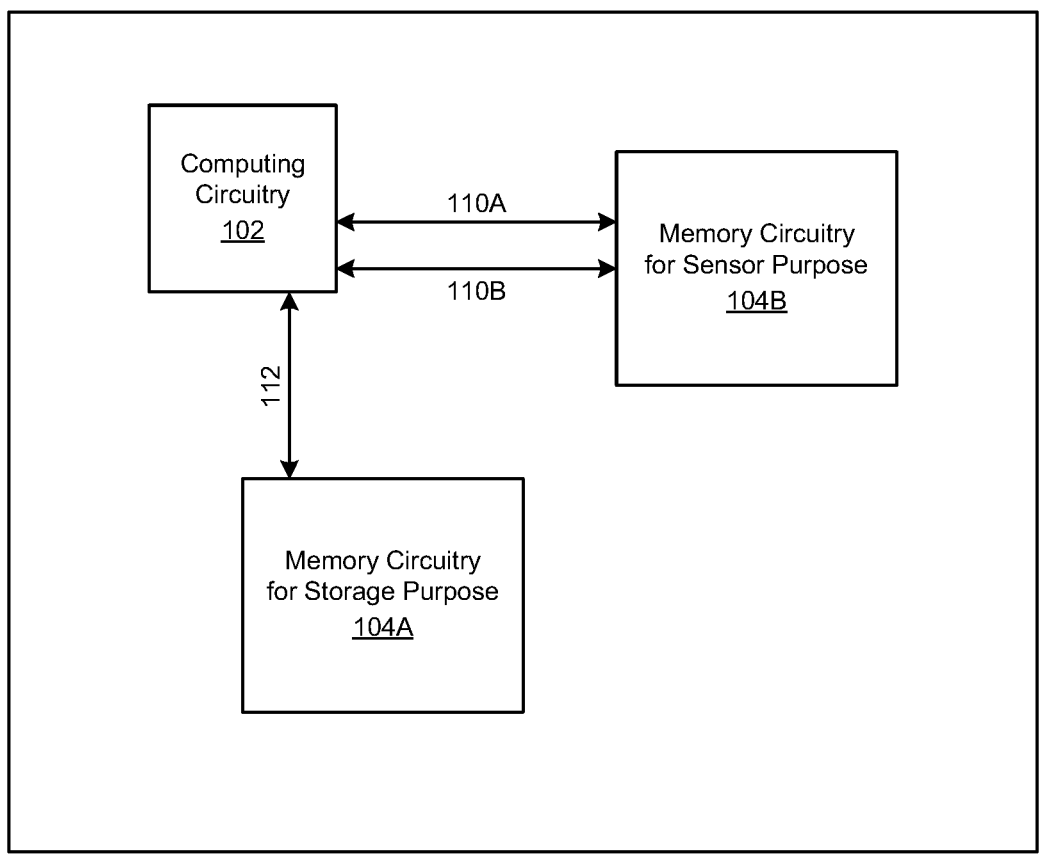
Figure 1C:
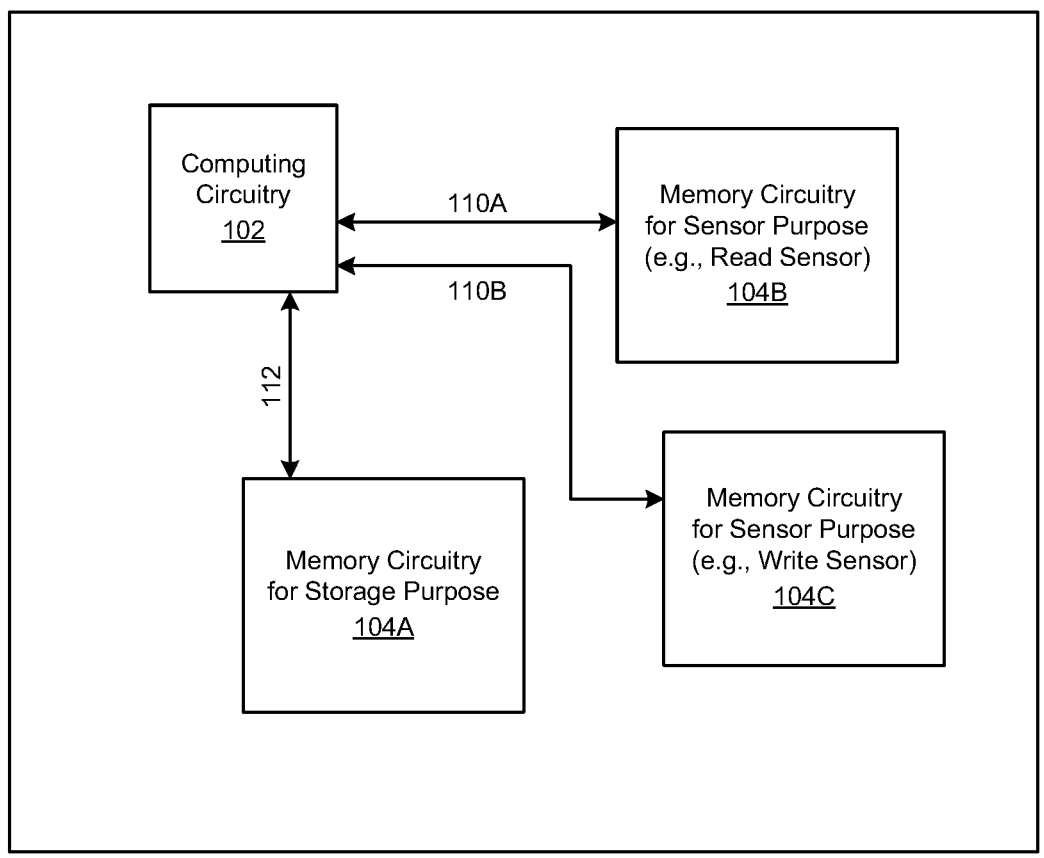

FIGS. 1A-1C illustrate various diagrams of memory systems 100A, 100B, and 100C that are adapted for performance sensing (and/or timing performance sensing) in accordance with various implementations described herein. In particular, FIG. 1A illustrates a diagram of computing circuitry 102 with associated memory 104A and including a memory delay monitor 104B providing an output signal 110 to the computing circuitry 102, FIG. 1B illustrates a diagram of another electronic device 100B adapted for performance sensing with the performance sensor providing multiple output signals, and FIG. 1C illustrates a diagram of an electronic device 100C adapted for performance sensing with multiple performance sensors providing the multiple output signals. In various implementations, the term "electronic device" may refer to various related structures, such as, e.g., a memory structure and/or a memory device. The various components described in FIGS. 1B-1C are similar in scope, function, and operation as described in FIG. 1A.

As shown in FIG. 1A, the electronic device 100A may be used as a sensor for sensing PVT variation in various memory applications.

The electronic device 100A may be implemented as a circuit, such as, e.g., an integrated circuit (IC), having the computing circuitry 102 (including digital, analog, mixed-signal, and/or radio frequency (RF) components), various memory circuitry 104A, 104B (SRAM and/or other types of memory), and other computer related components. In some implementations, the electronic device 100A may be designed as a system-on-a-chip (SoC) or other semiconductor die that integrates the computing circuitry 102, memory circuitry 104A, 104B, and any other related components on a single chip. In some instances, the electronic device 100A may be used in an embedded system for various electronic, mobile, automotive, biomedical, and Internet of Things (IoT) applications.

As shown in FIG. 1A, the electronic device 100A includes the memory circuitry 104A that may be implemented as first memory circuitry (or a first memory structure) that is disposed in a first area of the electronic device 100A. The first memory structure may have first memory cells with first transistors. In some cases, the memory circuitry 104A may be implemented and used for storage purposes. The memory circuitry 104A may use at least one memory cell array having a plurality of memory cells (or bitcells, such as, e.g., a 6T bitcell) arranged in a two-dimensional (2D) array with rows and columns.

As further shown in FIG. 1A, the electronic device 100A includes the memory circuitry 104B that may be implemented as second memory circuitry (or a second memory structure) that is disposed in a second area of the electronic device 100A that is different than the first area. The second memory structure may have second memory cells with second transistors that are separate from the first transistors. The process layers that form the transistor devices and determine their electrical properties, typically referred to as front-end layers (FEOL), are identical between the memory cell used in 104A and 104B. However, the transistors of the two memory cells in 104A & 104B are in different locations and as such they are referred to as first and second memory cells to distinguish which memory structure they are in. In some instances, the memory circuitry 104B may be implemented and used for sensor purposes. The memory circuitry 104B may use at least one memory cell array having a plurality of memory cells (or bitcells, such as, e.g., a 6T bitcell, a 1T DRAM, ROM bitcell, or any other bitcell) arranged in a two-dimensional (2D) array with rows and columns.

As will be described herein below, the second transistors of the second memory cells are arranged to provide an output oscillating frequency 110 for detecting variation of at least one of process, voltage and temperature of the first transistors of the first memory cells. The output oscillating frequency 110 may be based on performance of the second transistors of the second memory cells. The second memory structure provides the output oscillating frequency that is correlated to at least one of a read performance and a write performance of the first memory cells. The performance of the second transistors of the second memory cells is based on one or more operating conditions, and the operating conditions may refer to detecting the variation of at least one of process, voltage and temperature of the second transistors of the second memory cells. In some instances, the first transistors and the second transistors are fabricated simultaneously (i.e., at the same time) with similar transistor properties, which may be part of the overall process. For instance, the manner in which the transistors are formed during manufacturing will affect the properties of the transistors (e.g., quality and characteristics associated with physical attributes of the transistors resulting from fabrication). Also, in some instances, as described herein below in reference to FIGS. 2A-2C, a modification of the second memory cells (such as, e.g., modification of the bitcell) may enable improved measurement of the write performance.

In reference to FIG. 1A, the first memory structure 104A may operate as data storage, and the second memory structure 104B may operate as a performance sensor that selectively provides the output oscillating frequency (e.g., as output signal 110) based on characteristics associated with different operating conditions. In this instance, the first memory structure 104A and the second memory structure 104B may have memory cells that are fabricated with a same bitcell transistor layout in critical process layers that form the transistor devices and determine their electrical properties (typically referred to as front-end layers). The computing circuitry 102 may be implemented with a processor or a controller that is adapted to monitor the output oscillating frequency 110 from the second memory structure 104B. Also, the computing circuitry 102 may provide a control signal 112 that is used to adjust performance and/or power of the first memory structure 104A based on the output operating frequency 110A received from the second memory structure 104B. In some instances, a supply voltage (VDD) or settings for internal timing margins or read/write assist may be changed for the first memory structure 104A so as to cause a change in at least one of performance and power. Various performance improvement schemes and techniques will be described in greater detail herein below.

In various implementations, the first and second memory cells may be referred to as bitcells, and the memory cells may be configured to store at least one data bit value (e.g., related to storing logic 0 or 1). In some instances, the memory cells of the memory circuitry 104A, 104B may be used to implement SRAM circuitry. Thus, the memory cells may be implemented with multi-transistor SRAM cells, including various types of SRAM cells, such as, e.g., 6T CMOS SRAM and/or any other type of CMOS SRAM cells, such as, e.g., 4T, 8T, 10T or more transistors per bit. The memory cells may include SRAM cells, and the memory cell arrays of the memory circuitry 104A, 104B may include SRAM cell arrays. However, other types of memory cells may be used including DRAM and non-volatile memory may be used.

In various implementations, the performance sensor circuitry 104B may be disposed in a second area of the electronic device 100A that is different than the first area. As will be described herein below, the performance sensor circuitry 104B may include an array of bitcells that are implemented as a performance detector with second transistors that are separate from the first transistors of the memory circuitry 104A. In some instances, the second area is manufactured on (or part of) a same wafer or die, i.e., a same integrated circuit, such that the performance detector detects (or senses) skew of the memory circuitry 104A on the same wafer. The second transistors of the performance sensor circuitry 104B may be arranged for detecting (or sensing) performance variation of the first transistors of the memory cells of the memory cell array 104A. I.e., the second transistors of the performance sensor circuitry 104B may be arranged for detecting performance variation of the memory circuitry 104A, which is used for storage purposes. In some instances, detecting performance variation of the memory circuitry 104A may include sensing performance variation of the first transistors. As such, the second transistors may be formed along with the first transistors, and as such, the second transistors may be formed (or fabricated) at the same manufacturing time when the first transistors are formed (or fabricated).

In some implementations, detecting (or sensing) performance variation may include detecting global complementary metal-oxide-semiconductor (CMOS) process variation of the memory cells of the memory circuitry 104A, 104B. Further, detecting process variation may include detecting a process point when the second transistors detect that the process variation has skewed sufficiently to a SF process point. This naming convention of the process point refers to a first position and a second position for the process point. For instance, the SF process point refers to detecting, in a first position (S), slower N-type MOS transistors of the first transistors of an N-type of the multiple types and to detecting, in a second position (F), faster P-type MOS transistors of the first transistors of a P-type of the multiple types. In another instance, detecting performance variation may also include detecting another process point when the second transistors detect that the process variation has skewed sufficiently to a FS process point. This convention of 'S' and 'F' describes corners that may be used by foundries to model the effect of extreme variations in the manufacturing of MOS transistors. A process corner describes skew attributes of relevant components. In CMOS processes, when relying on n-type and p-type FET transistors, the corner conventionally describes a state of N-MOS, followed by P-MOS. At process corners where a particular transistor is slow (S), the threshold voltage (Vt) of the transistor may be modelled as higher than a typical Vt, to thereby include one or more or all manufacturing effects (variations) that may reduce the drain current of the transistor than what may be typically expected. At process corners where a particular transistor is fast (F), the threshold voltage (Vt) of the transistor may be modelled as lower than a typical Vt to include one or more or all manufacturing effects (variations) that may increase the drain current of the transistor to a value higher than what may be typically expected.

In some implementations, memory cells may be laid-out in a scheme that has widths and spaces between shapes that may not normally be allowed. In addition, density of the shapes may be different from that of regular logic devices. As such, it is important to be able to monitor performance of the memory cells separately from logic transistors, which may be placed with different design rules. For instance, the performance sensing circuitry 104B may be used to detect how much the global CMOS performance has skewed within the slow and fast region, including cross corners.

In SRAM design, write operations may be somewhat worse at the SF process point, due to pull-up transistors being stronger than pass-gates. If the performance sensor only measures the SS process point, the voltage correction applied in the SF process point may be inaccurate. In some instances, this can lead to write failures of the SRAM at SF process point where the sensor allows lower voltage of operation than required by the write operation of the SRAM instance at the SF process point. Therefore, detecting when a manufactured memory instance is at a global SF process point may be extended to write operations (and in other situations the read operation), and this detection technique may significantly improve performance and dynamic power in the memory circuitry 104A of the electronic device 100A.

The performance of memory write and read operations may have different correlation with respect to process skew of the first transistors in the memory circuitry 104A. An SF process point may make memory cells hard to write as the slow NMOS transistors may not overcome the pull-up strength of the PMOS, while an FS process point may cause the cell information to be lost due to insufficient pull-up strength of the PMOS during a read operation. Therefore it is advantageous to use a dedicated memory performance sensors for read and write operations.

As shown in FIG. 1B, the electronic device 100B may include the first memory circuitry 104A and the second memory circuitry 104B. In some cases, the second memory circuitry 104B may be implemented and used for multiple sensor purposes, such as, e.g., read sensor purposes and write sensor purposes. The various components described in FIG. 1B are similar in scope, function, and operation as described in FIG. 1A.

In some implementations, as shown in FIG. 1B, the second memory circuitry or structure 104B may selectively provide multiple output oscillating frequencies, such as, e.g., a first output oscillating frequency 110A that is associated with read operations and a second output oscillating frequency 110B that is associated with write operations. As such, as will be described further herein below in reference to FIGS. 3A, 3B-1, 3C-1, the second memory circuitry or structure 104B may be configured (or modified) to selectively provide the first output oscillating frequency 110A that is associated with read performance of read operations and the second output oscillating frequency 110B that is associated with write performance of write operations. The second output oscillating frequency 110B may be similar to or different than the first output oscillating frequency 110A.

As further shown in FIG. 1C, the electronic device 100C may include the first memory circuitry 104A, the second memory circuitry 104B, and a third memory circuitry 104C. The third memory circuitry 104C may be implemented as a third memory structure that is disposed in a third area of the electronic device 100C that is different than the first area and the second area. The third memory structure may have third memory cells with third transistors that are separate from the first and second transistors. In some instances, the second memory circuitry 104B may be implemented and used for sensor purposes, such as, e.g., read sensor purposes, and the memory circuitry 104C may be implemented and used for various other sensor purposes, such as, e.g., write sensor purposes. Also, the third memory circuitry 104C may use at least one memory cell array having a plurality of memory cells (or bitcells, such as, e.g., a 6T bitcell) arranged in a two-dimensional (2D) array with rows and columns. Various components described in FIG. 1C are similar in scope, function, and operation as described in FIGS. 1A-1B.

In some implementations, as shown in FIG. 1C, the second memory circuitry or structure 104B may selectively provide the output oscillating frequency as a first output oscillating frequency 110A that is associated with read operations, and the third memory circuitry or structure 110C may selectively provide a second output oscillating frequency 110B that is associated with write operations. As such, as will be described further herein below in reference to FIG. 3B-1, the second memory circuitry or structure 104B may be configured (or modified) to selectively provide a first output oscillating frequency 110A that is associated with read performance of read operations. Also, as will be described further herein below in reference to FIG. 3C-1, the third memory circuitry or structure 104C may be configured to operate as a separate performance sensor that selectively provides the second output oscillating frequency 110B that is associated with write performance of write operations and that is different than the first output oscillating frequency 110A.

In various implementations, as described further herein, each memory circuitry or structure 104B, 104C may include an array of memory cells (or bitcells) that operate as a performance monitor that provides an output oscillating signal with repetitive switching having a frequency that is correlated to at least one of a read performance (e.g., 104B) and a write performance (e.g., 104B) of the memory cells based on at least one of transistor properties and operating conditions of the memory cells. Also, the computing circuitry 102 may operate as a controller that activates a sequence of at least one of wordlines (WLs) and bitlines (BLs/BLBs) so that each output oscillating signal 110A, 110B has a repetitive periodic pattern. The wordlines (WLs) and bitlines (BLs/BLBs) are shown in FIGS. 3A, 3-1, 3C-1. Also, the first memory circuitry or structure 104A may include another array of memory cells that operates as data storage, wherein the process monitors 104B, 104C support variable voltages applied to the data storage 104A that allows for increased operating voltages for increased performance and power of the data storage 104A and/or that allows for lowered operating voltages for reduced performance and power of the data storage 104A. The sequence of at least one of the wordlines (WLs) and the bitlines (BLs/BLBs) may provide for at least one of a predetermined read order of bits and a predetermined write order of bits through the array of memory cells for either memory sensor structure 104B and 104C.

In various implementations, each memory circuitry 104B, 104C may operate as a performance sensor that selectively provides an output oscillating frequency 100A, 110B based on various reactive characteristics associated with different operating conditions. Under some circumstances, these operating conditions may refer to process, voltage, and/or temperature (PVT) associated with the memory cells (bitcells) of the memory circuitry 104B, 104C. For instance, voltage (V) and temperature (T) may be environment dependent, whereas process (P) variation (SS, FF, SF, FS) may refer to a variation of a product (or device) as fabricated. In some cases, reactive characteristics may refer to how the memory cells (bitcells) perform in a surrounding environment, and operating conditions may refer to the actual environmental characteristics. For instance, in reference to operating conditions, the memory cells (bitcells) may be operating in a high temperature environment (such as, e.g., 125° C.), and reactive characteristics may refer to how the memory cells (bitcells) react to or perform in the high temperature environment (such as, e.g., 125° C.). In this instance, depending on characteristics of the memory cells (bitcells) in the memory circuitry 104B, 104C, performance of the memory circuitry 104A may be adjusted (or modified) for improvement and/or increased efficiency.

In some implementations, as described in reference to FIG. 1A, the performance monitor or sensor 104B may provide an output signal 110 having a read performance based oscillating frequency or a write performance based oscillating frequency. In some implementations, as described in reference to FIG. 1B, the performance monitor or sensor 104B may provide multiple output signals with one output signal 110A having a read performance based oscillating frequency and another output signal 110B having a write performance based oscillating frequency. In some implementations, as described in reference to FIG. 1C, multiple performance monitors or sensors 104B, 104C may be used to provide multiple output signals with one performance monitor or sensor 104B providing one output signal 110A having a read performance based oscillating frequency and another performance monitor or sensor 104C providing another output signal 110B having a write performance based oscillating frequency. As such, memory circuitry may be configured to provide one performance monitor that provides only a read timing oscillation or only a write timing oscillation, or provide one performance monitor that provides two different (read and write) timing oscillations, or provide two different monitors that provide two different oscillations (one monitor for a read and one monitor for a write).

Figures 1, 2A:
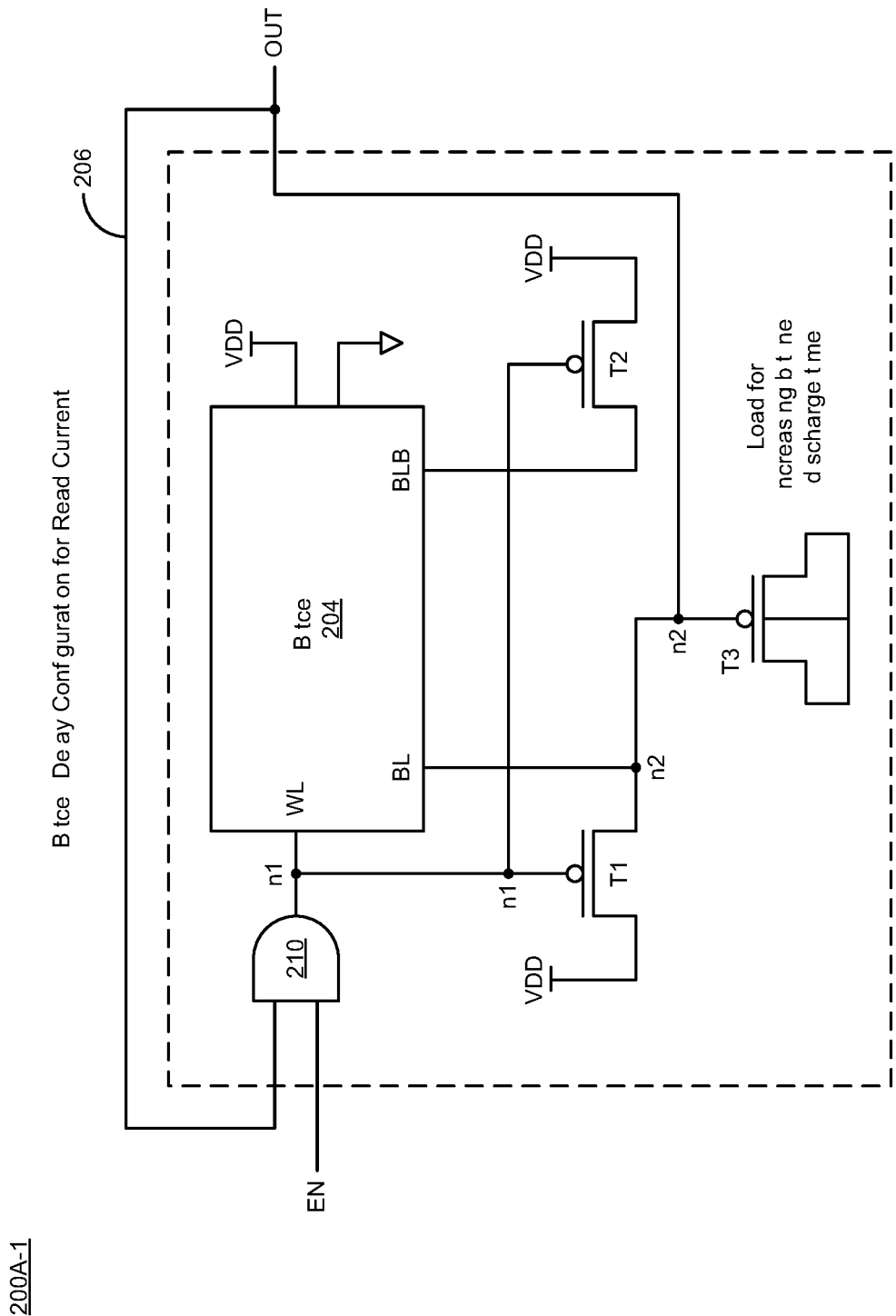
FIGS. 2A-1, 2A-2, 2B-1, 2B-2, and 2C illustrate diagrams of various bitcell configurations adapted for sensing global characteristics in accordance with various implementations described herein.
Figures 2, 2A:
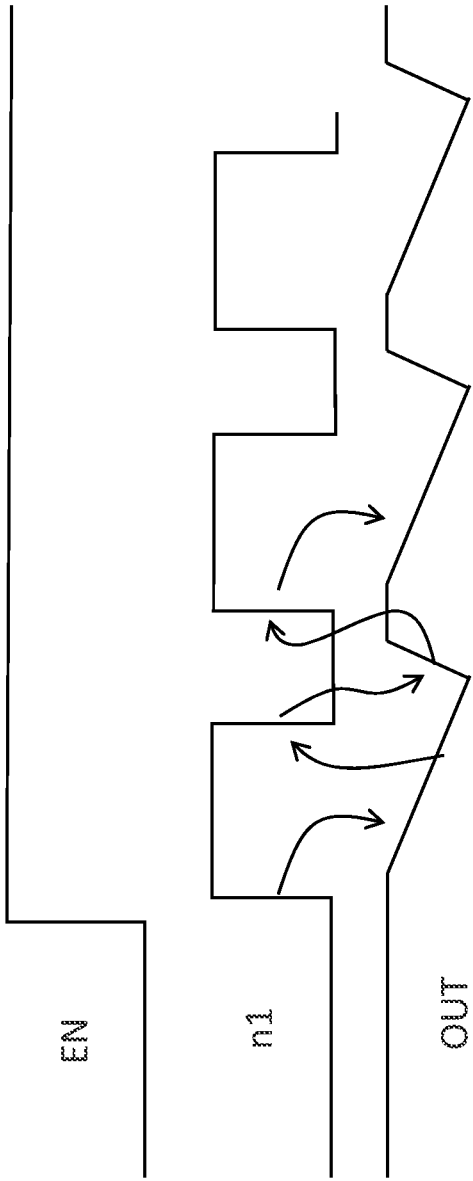
Figures 1, 2B:
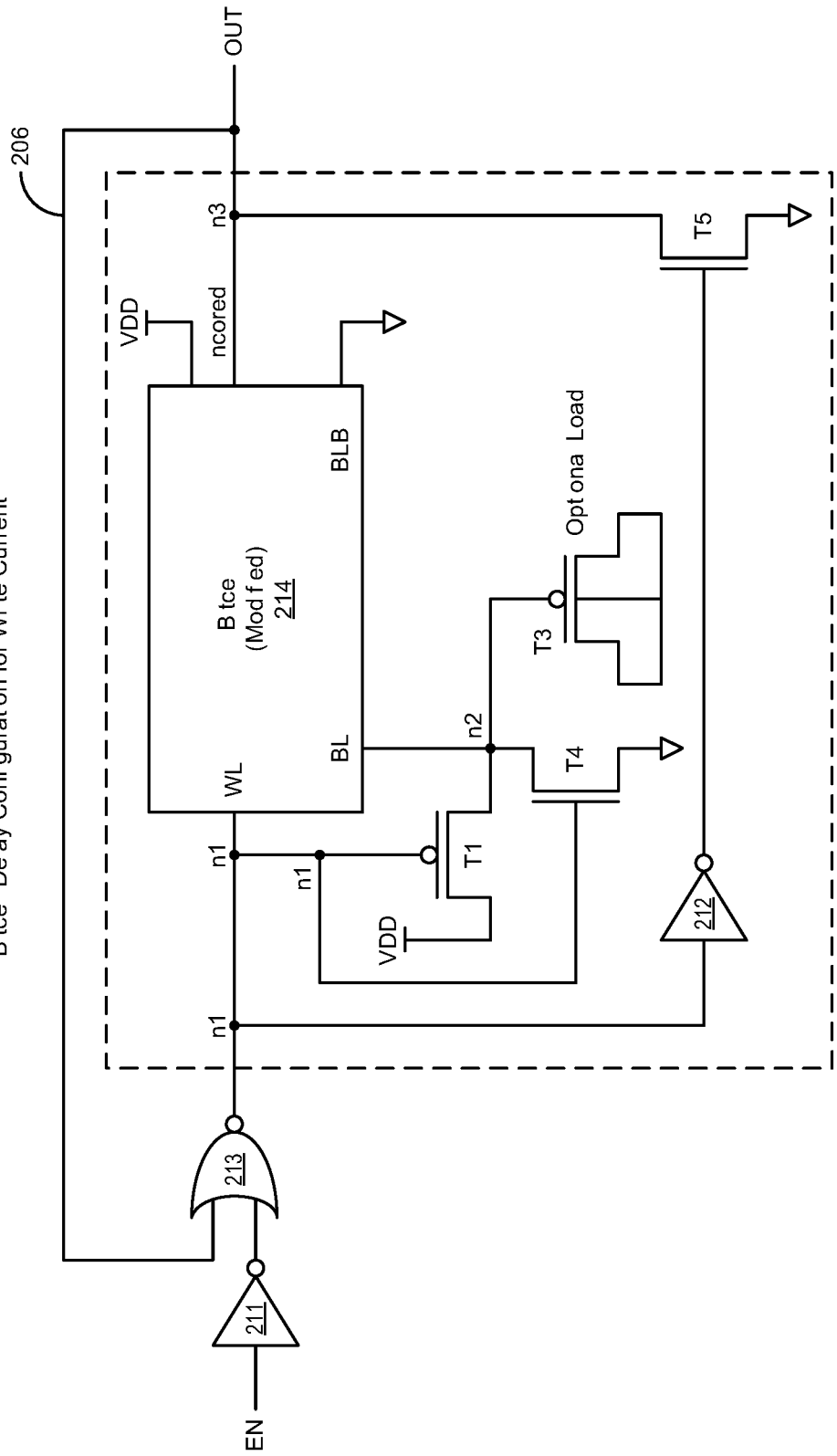
Figures 2, 2B:
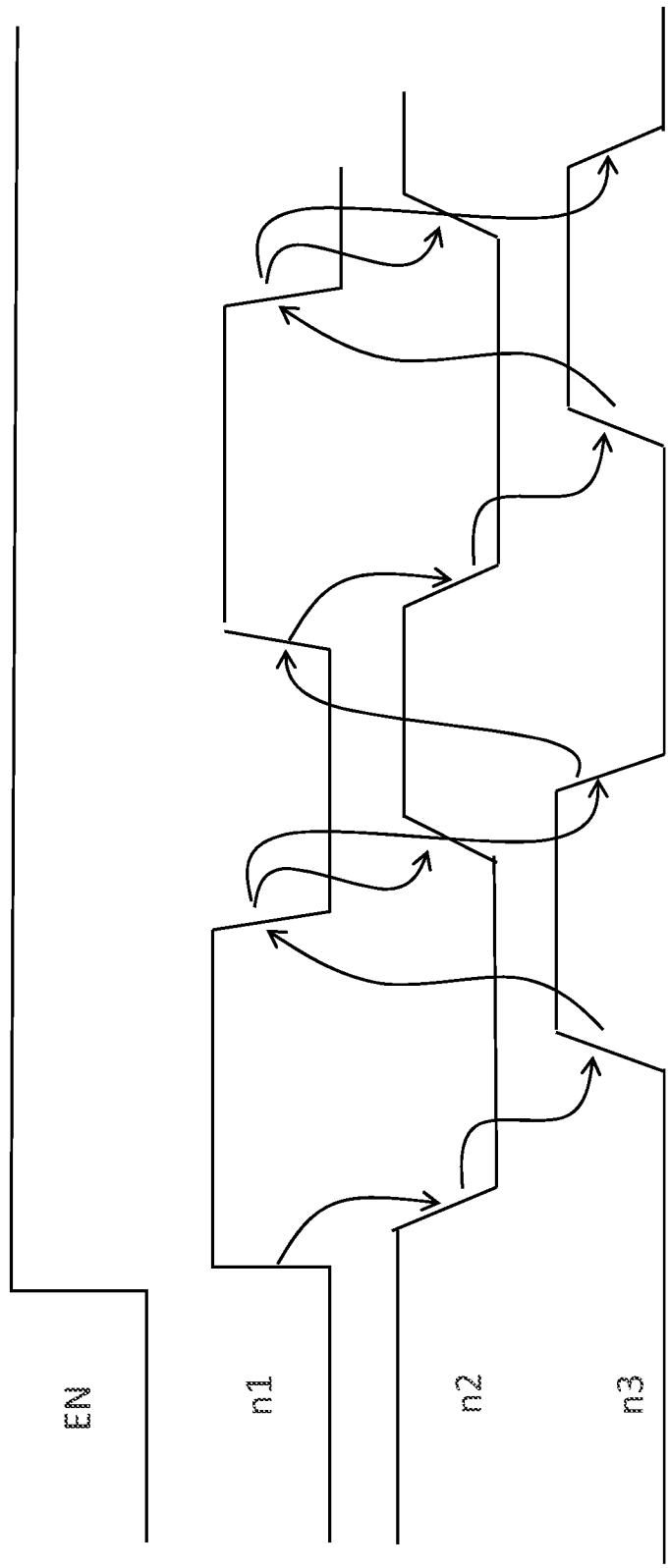
Figure 2C:
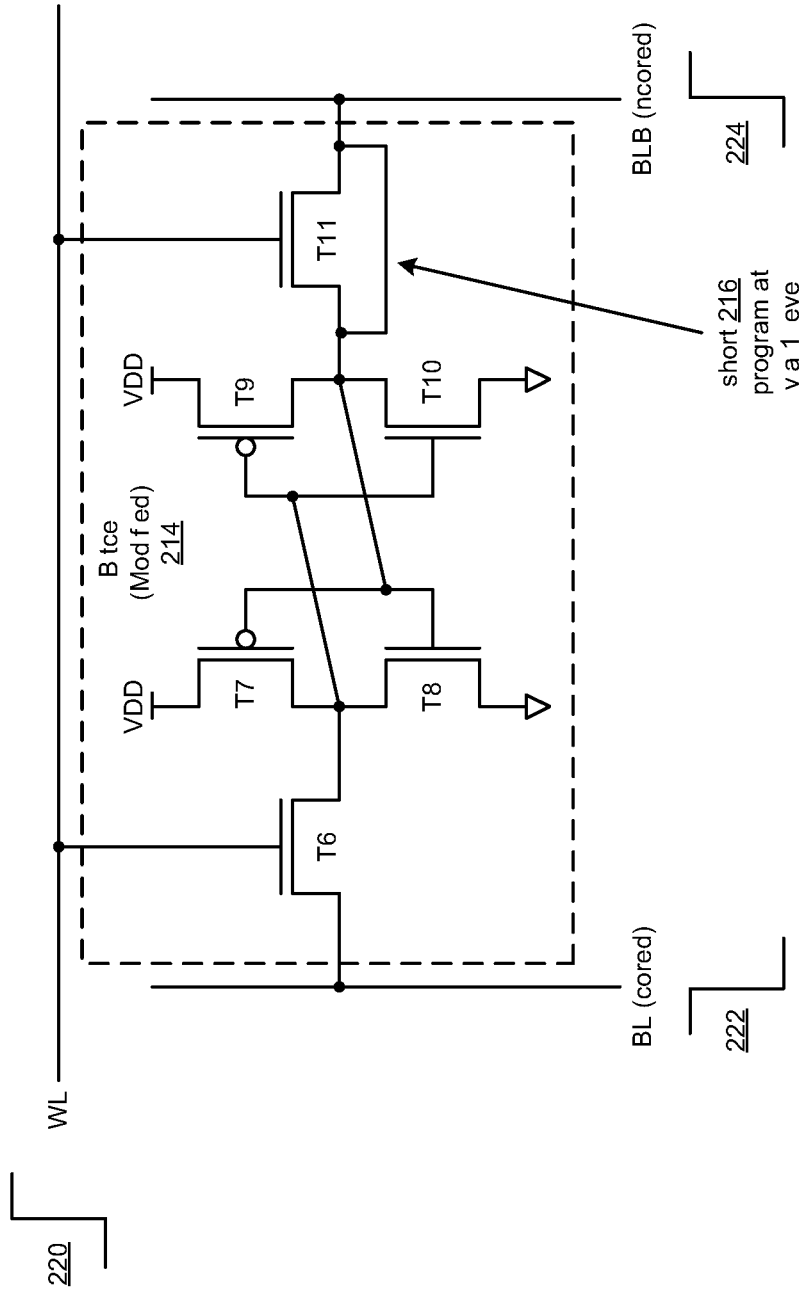

FIGS. 2A-1, 2A-2, 2B-1, 2B-2 and 2C illustrate diagrams of various memory array configurations adapted for performance sensing in accordance with implementations described herein. In particular, FIGS. 2A-1 and 2A-2 show a bitcell delay configuration 200A-1 for read current along with a corresponding timing waveform 200A-2, FIGS. 2B-1 and 2B-2 show a bitcell delay configuration 200B-1 for write current along with a corresponding timing waveform 200B-2, and FIG. 2C shows a modified bitcell configuration 200C for sensing write performance.

As shown in FIG. 2A-1, the bitcell delay configuration 200A-1 is adapted for read speed sensing. In some implementations, the bitcell delay configuration 200A-1 may be implemented with memory cells for random access memory (RAM), e.g., including static RAM (SRAM), and the bitcell delay configuration 200A-1 may refer to an SRAM read speed sensor for enabling AVS (Adaptive Voltage Scaling). It may be seen that although the memory cells used by the sensor may be classified as a typical random access memory cells, that the memory sensor does not require random accesses. The address pattern may be specified a priori or it may come through a random number generator, but the sequence of addresses used may not be done in a random uncontrolled fashion.

The bitcell delay configuration 200A-1 includes a bitcell 204 having a wordline input port (WL) at node n1, a bitline port (BL) at node n2, and a bitline-bar port (BLB). The bitcell delay configuration 200A receives an enable signal (EN) and provides an output signal (OUT). The output signal (OUT) is connected or looped back to an input of AND gate 210. The bitcell delay configuration 200A-1 includes the AND gate 210 that receives an input enable signal (EN) and provides the output signal (n1) to the wordline (WL) of the bitcell 204 via node n1. The bitcell 204 is coupled to supply voltage (VDD) and ground (GND).

The bitcell delay configuration 200A-1 includes a transistor T1 that is activated based on the output signal from the AND gate 210 via node n1. The transistor T1 is coupled between a supply voltage (VDD) and the bitline (BL) of the bitcell 204 at node n2. In some instances, the transistor T1 may be implemented with a PMOS transistor. In other instances, the transistor T1 may also be implemented with an NMOS transistor with the source connected to ground in other configurations.

The bitcell delay configuration 200A-1 includes another transistor T2 that is also activated based on the output signal from the AND gate 210 via node n1. The transistor T2 is coupled between the supply voltage (VDD) and the bitline-bar port (BLB) of the bitcell 204. As shown, the bitline port (BL) may be coupled to the terminal for the output signal (OUT) via node n2. In some cases, the transistor T2 may be implemented with a PMOS transistor. In other instances, the transistor T2 may also be implemented with an NMOS transistor in other configurations with the source connected to ground (GND), such that T1 and T2 are of the same polarity.

The bitcell delay configuration 200A-1 includes another transistor T3 that with the gate connected to the bitline (BL) signal. The transistor T3 is configured as a MOS capacitor. The transistor T3 may be used to provide a bitline load for increasing bitline discharge time. In some instances, the transistor T3 may be implemented with a PMOS transistor. In other instances, the transistor T3 may also be implemented with an NMOS transistor in other configurations. For instance, there may be a provision to ensure that the bitcell 204 comes-up with a ZERO stored on an internal node connected to the bitline (BL) for the oscillator to work.

In some implementations, the bitcell delay configuration 200A-1 in FIG. 2A-1 as a read sensor may be sensitive to bitline discharge time. In an array configuration, all of the wordlines (WLs) cannot be switched-on at the same time as this may reduce the bitline discharge time and increase sensor power. However, activating at least one wordline WL at a time may increase bitline load and may reduce power. Also, applying this technique to periphery devices T1, T2 and T3 may reduce their delay contribution.

FIG. 2A-2 shows the timing waveform 200A-2 that corresponds to the bitcell delay configuration 200A-1 for read current. Upon EN=1, WL (n1) is activated, BL and BLB are released, and then BL is discharged through the bitcell 204. This causes the AND gate to pull WL (n1) low and charge the BL by activating T1, which re-starts the cycle. FIG. 2A-2 assumes a separate provision to ensure that the bitcell 204 comes-up with a ZERO stored on an internal node connected to the bitline (BL).

As shown in FIG. 2B-1, the bitcell delay configuration 200B-1 is adapted for write speed. In some implementations, the bitcell delay configuration 200B-1 may be implemented with RAM, e.g., including SRAM, and the bitcell delay configuration 200B-1 may refer to an SRAM write speed sensor for enabling AVS. The various components described in FIG. 2B-1 are similar in scope, function, and operation as described in FIG. 2A-1.

The bitcell delay configuration 200B-1 includes the bitcell 214 having a wordline input port (WL) at node n1, a bitline port (BL) at node n2, a bitline-bar port (BLB), and an ncored port (ncored). In some instances, the bitcell 214 may refer to bitcell 214 in FIG. 2C. However, in other instances, other types of bitcells may be used, such as, e.g., a 6T bitcell. The bitcell delay configuration 200B-1 includes an inverter 211 that received the enable signal (EN) and provides an inverted enable signal. The bitcell delay configuration 200B-1 includes a NOR gate 213 that receives the inverted enable signal from the inverter 211 and the output signal (OUT) that is connected to or looped back from node n3.

The bitcell delay configuration 200B-1 includes an inverter 212 that receives the wordline signal (WL) from node n1 and provides an inverted signal to a gate of another transistor T5, which is coupled between the terminal for the output signal (OUT) at node n3 and ground (GND, VSS). Further, as shown, the ncored port (ncored) is also coupled to the terminal for the output signal (OUT) at node n3. The transistor T5 may be implemented with an NMOS transistor. In other instances, the transistor T5 may also be implemented with a PMOS transistor in other configurations. The bitcell 214 is coupled to supply voltage (VDD) and ground (GND).

The bitcell delay configuration 200B-1 includes the transistor T1 that is activated based on the wordline signal (WL) via node n1. The transistor T1 is coupled between a supply voltage (VDD) and the bitline port (BL) of the bitcell 204 at node n2. The transistor T1 may be implemented with a PMOS transistor. In other instances, the transistor T1 may also be implemented with an NMOS transistor in other configurations.

The bitcell delay configuration 200B-1 includes the transistor T3 that is activated based on the bitline port (BL) signal via node n2. The transistor T3 is coupled together to operate as a MOS capacitor. The transistor T3 may be used to provide an optional bitline load for increasing bitline discharge time. The transistor T3 may be implemented with a PMOS transistor. In other instances, the transistor T3 may also be implemented with an NMOS transistor in other configurations.

The bitcell delay configuration 200B includes another transistor T4 that is activated based on the input signal (IN) via node n1. The transistor T4 is between the bitline port (BL) at node n2 and ground (GND, VSS). In some instances, the transistor T4 may be implemented with an NMOS transistor. In other instances, the transistor T4 may also be implemented with a PMOS transistor in other configurations.

FIG. 2A-2 shows the timing waveform 200A-2 that corresponds to the bitcell delay configuration 200A-1 for read current. In some implementations, when EN=0, then n1 is LOW, and n3 is LOW. Upon EN=1, n1 goes HIGH, n3 is released, and n2 is pulled low to write ZERO to the bitcell. When write is complete, n3 is pulled HIGH, causing n1 to go low. Then, when the wordline (WL, n1) is turned off and BL is charged HIGH, the inverter pulls n3 low, and it all starts again. When n3 is pulled low this causes the internal state of the modified bitcell, 214, to return to a one.

As shown in FIG. 2C, the bitcell delay configuration 200C refers to modifying the bitcell 204 as bitcell 214 to access one of the internal nodes of the cross-coupled inverter of the bitcell (NCORED). In some instances, modification of the bitcell 204 may enable an improved measurement of write performance.

As shown in FIG. 2C, the bitcell 214 may be implemented with a 6T bitcell. Alternatively different bitcells containing across-coupled inverter to store data that may have access ports controlled by one or more wordlines. Generally, there are two types of memory structures, such as, e.g., one-wordline devices and multi-wordline devices. One wordline devices (e.g., DRAM, SRAM) refer to devices having only one access port, which may be referred to as access devices. The bitcells may be single rail or dual rail. Dual rail may refer to when a wordline and bitlines are driven by different voltage supplies, and possibly driven to different voltage levels. In some instances, SRAM bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Therefore, although these multi-ports transistor types may vary within each bitcell, there may also be a need to have a variation between arrays as in type one, like a left half array and a right half array.

As shown in FIG. 2C, the bitcell 204 may include multiple transistors (T6, T7, T8, T9, T10, T11 that are arranged to operate as a 6T bitcell. As also shown, the bitcell 204 receives a wordline signal (WL) at gates of transistors T6, T11, and the bitcell 204 also provides complementary bitline signals (BL, BLB) via transistors T6, T11. In some instances, the bitline (BL) refers to a cored bitline, and the bitline-bar (BLB) refers to an ncored bitline. In some instances, during rise of the wordline signal (WL) 220, the bitline signal (BL) may ramp-down 222, and the bitline-bar signal (BLB) may ramp-up 224. Also, as shown, modification of the bitcell 204 may refer to providing a coupling line (or short, effectively disabling or bypassing the transistor T11) 216 between the source terminal and the drain terminal of the transistor T11, which may be programmed at a performance level that may have no significant impact on the characteristics of the transistors T6 ... T11 using within the bitcell. In some implementations, the effective electrical characteristics of the multiple transistors (T6 ... T11) of each bitcell remain unchanged, and the effective electrical characteristics keep drive strength of each transistor of the multiple transistors (T6 ... T11) unchanged. In some instances, the drive strength of each transistor may refer to its current carrying capability and threshold voltage. Since disabled or bypassed devices and/or wires may add capacitance, they may still contribute to the timing characteristics of the bitcell inverters (112A, 112B, ..., 112N). As a specific example, the connection between the source and drain of T11 may be made at via 1 level.

Figure 3A:
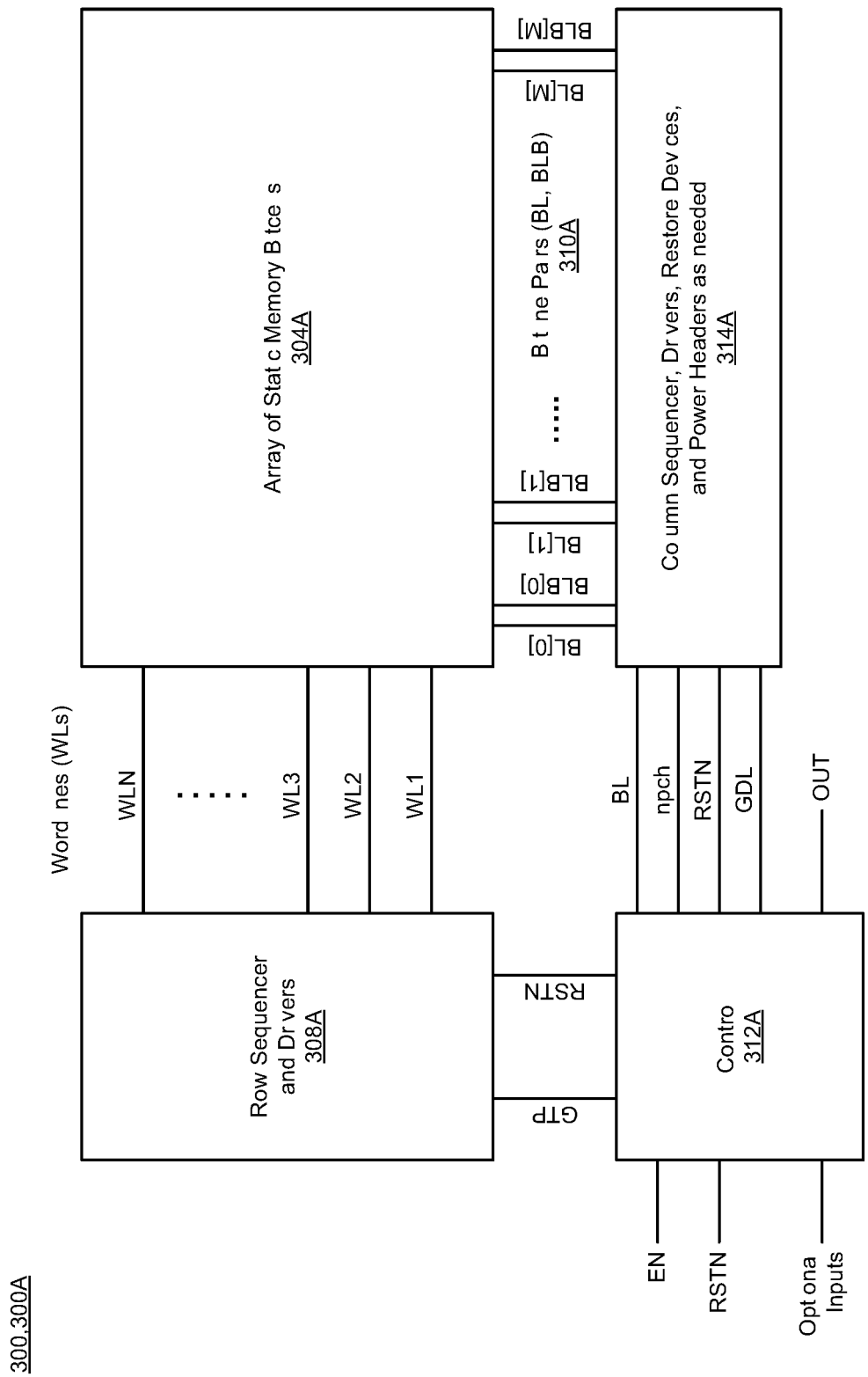
Figures 1, 3B:
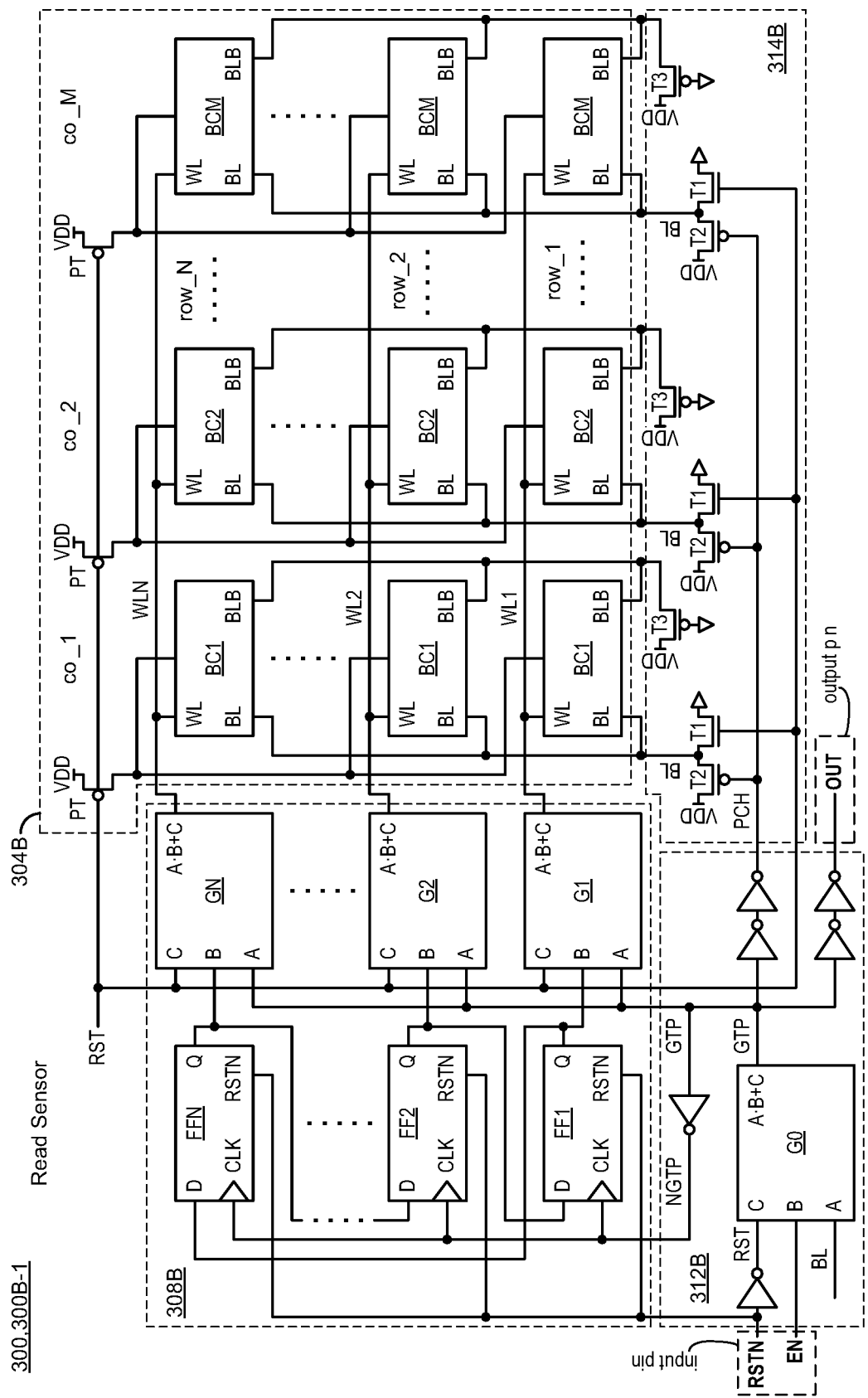
Figures 2, 3B:
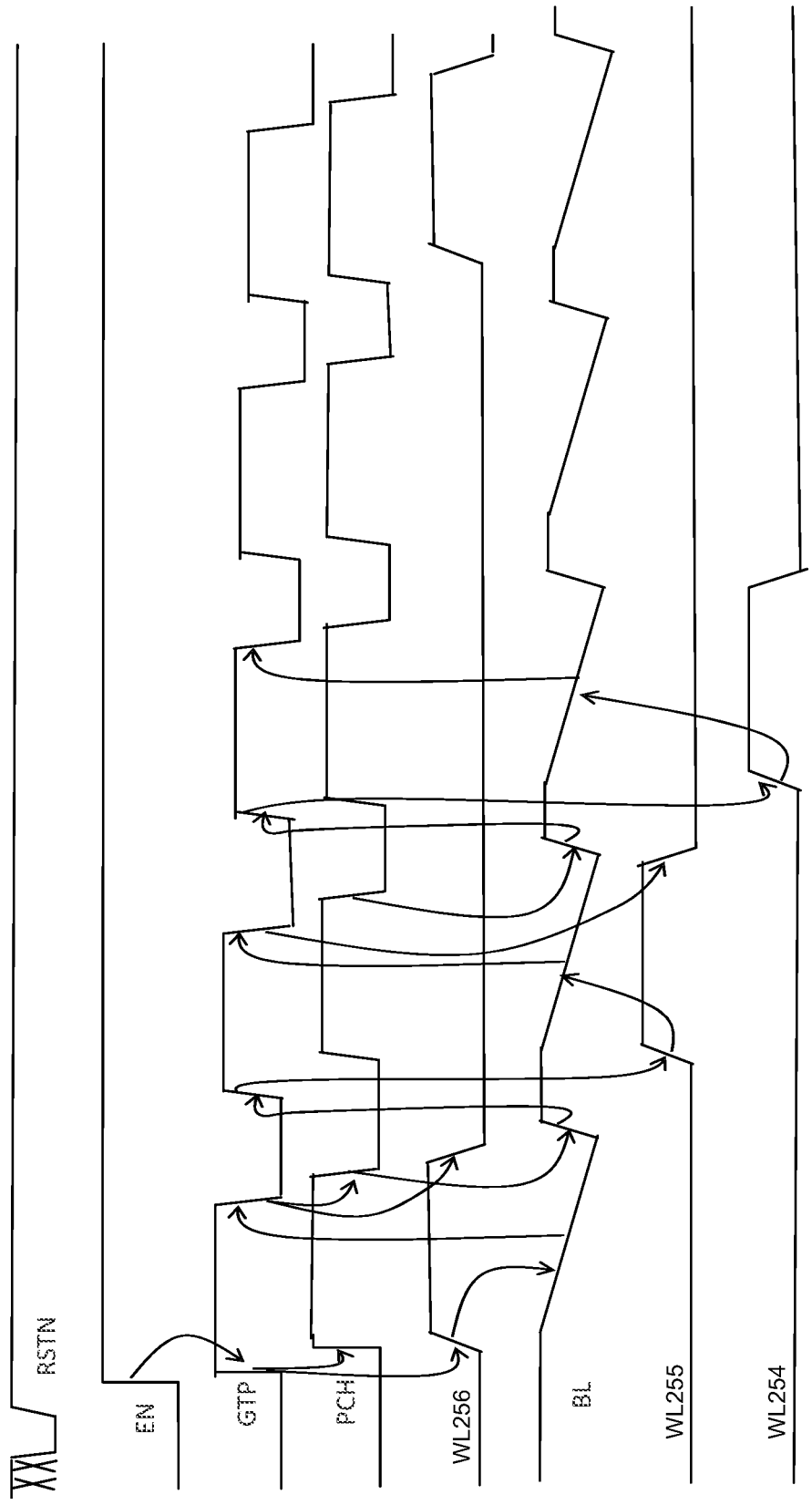
Figures 1, 3C:
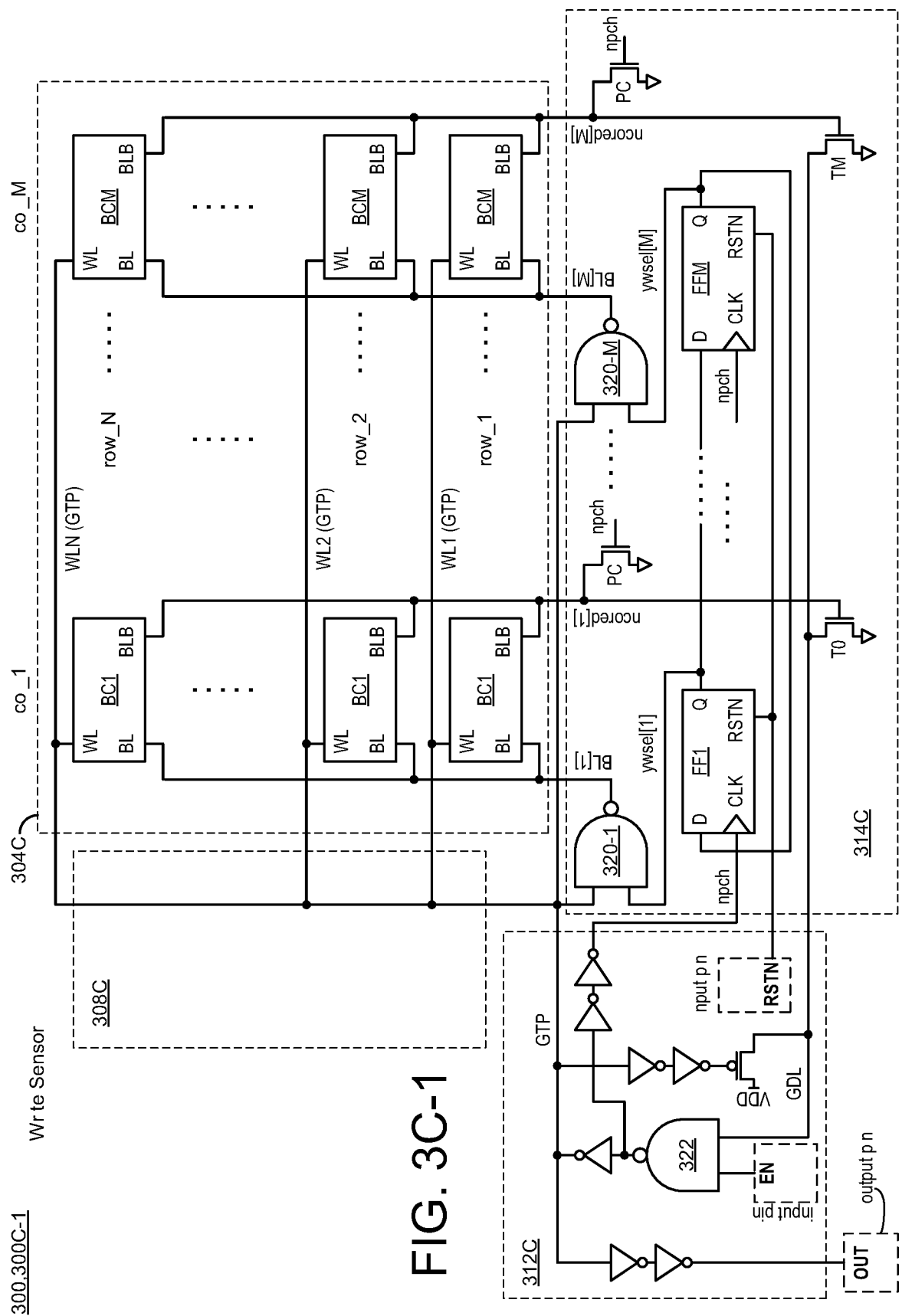

FIGS. 3A, 3B-1, 3B-2, 3C-1 and 3C-2 illustrate diagrams of memory circuitry 300 adapted for performance sensing in accordance with various implementations described herein. In particular, FIG. 3A shows a diagram of memory circuitry 300A that is adapted for sensing read and write performance, FIG. 3B-1 shows a diagram of memory circuitry 300B-1 that is adapted for sensing read performance along with a corresponding timing waveform 300B-2, and FIG. 3C-1 shows a diagram of memory circuitry 300C-1 that is adapted for sensing write performance along with a corresponding timing waveform 300C-2. In reference to FIGS. 3A, 3B-1, 3C-1, the memory circuitry 300A, 300B-1, 300C-1 may be implemented as the second memory circuitry 104B of FIGS. 1A, 1B, and 1C.

In some implementations, different operating conditions may refer to operating under various environmental conditions, such as, e.g., temperature. As described herein above, the first memory circuitry or structure 104A, the second memory circuitry or structure 104B, and the third memory circuitry or structure 104C may have one or more memory cells (or bitcells) that are fabricated with a same bitcell FEOL transistor layout. Further, in some instances, as described herein, the first memory circuitry or structure 104A, the second memory circuitry or structure 104B, and the third memory circuitry or structure 104C may be fabricated simultaneously with transistors having the same bitcell transistor layout and similar transistor properties.

As shown in FIG. 3A, the memory circuitry 300A may include an array of static memory bitcells 304A, row circuitry 308A (e.g., row sequencer and drivers), bitline pairs (BL, BLB) 310A, control circuitry 312A, and column circuitry 314A (e.g., column sequencer, drivers, restore devices, and power headers, as needed). The memory circuitry 300A may include one or more wordlines (WLs), and the array of static memory bitcells 304A may be coupled to row circuitry 308A via a number (N) of wordlines (WL1, WL2, . . . , WLN), wherein N may be 256. The memory circuitry 300A may include one or more bitline pairs (BL, BLB) 310A (i.e., a number [M] of bitline pairs BL[1]/BLB [1] . . . BL[M]/BLB[M]), and the array of static memory bitcells 304A may be coupled to the column circuitry 314A via the one or more bitline pairs (BL, BLB) 310A. The control circuitry 312A may receive one or more input signals, such as, e.g., an enable signal (EN), a reset signal (RSTN), and optional inputs. The control circuitry 312A may provide one or more output signals to the row circuitry 308A, such as, e.g., a global timing pulse (GTP) and the reset signal (RSTN). The control circuitry 312A may also provide one or more output signals to the column circuitry 314A, such as, e.g., a global bitline signal (GBL), a precharge signal (npch), and the reset signal (RSTN).

Further, the control circuitry 312A may provide an at least one output signal (OUT), which may be a signal derived from or buffered from the global timing pulse (GTP), in which OUT may provide an output oscillating frequency. In this instance, the memory circuitry or structure 300A may provide the output oscillating signal with repetitive switching having a frequency that is correlated to at least one of a read performance and a write performance of the memory bitcells of the memory circuitry or structure 300A based on operating conditions of the memory bitcells. In some cases, a modification of the memory bitcells in the array of static memory bitcells 304A enables improved measurement of the write performance, in a manner as described herein below in reference to FIG. 3C-1. In some instances, the memory circuitry 300A includes multiple wordlines (WLs), and a sequence of the multiple wordlines (WLs) may be activated so that the output oscillating signal has a repetitive periodic pattern. In other instances, the memory circuitry 300A includes multiple bitlines (BLs/BLBs), and a sequence of the multiple bitlines (BLs/BLBs) may be activated so that the output oscillating signal has a repetitive periodic pattern.

As described herein, the output oscillating frequency may be used to alter performance of the first memory circuitry or structure 104A.

In some implementations, the memory circuitry 300A may be configured (or modified or adapted) to operate as a read sensor that selectively provides the output oscillating frequency as a first output oscillating frequency that is associated with read operations, e.g., as described herein below in reference to FIG. 3B-1. In this instance, the memory circuitry 300A (as a read sensor) may selectively provide the output oscillating frequency as a first output oscillating frequency that is associated with read performance of read operations.

In some implementations, the memory circuitry 300A may be configured (or modified or adapted) to operate as a write sensor that selectively provides a second output oscillating frequency that is associated with write operations, e.g., as described herein below in reference to FIG. 3C-1. In this instance, the memory circuitry 300A (as a write sensor) may selectively provide the output oscillating frequency as a second output oscillating frequency that is associated with write performance of write operations. In some instances, the memory circuitry 300A may be configured (or modified or adapted) to operate as a write sensor and a read sensor.

In reference to FIG. 3A, to make the AVS for static memory (e.g., SRAM) work effectively, detecting operating conditions of an actual static memory instance may be considered, wherein there are at least two types of performance metrics associated with a bitcell, such as, e.g., read speed and write speed. For instance, read speed may be a function of discharge rate, and write speed where a bitcell is flipped using a write driver. Since a bitcell is a special device, the performance monitor should also be made of the same devices. Also, since the bitcell has a constraint to have an array like structure with proper end cells (e.g., a wordline end cell and a bitline end cell), the static memory monitor should also look like the same. The static memory has local variations, which the AVS may want to discard, whereby AVS targets to detect timing variation determined by global process, voltage and temperature (PVT). Hence, multiple bitcells may be utilized to average the impact due to local variations. In some cases, there may be under-shoots voltage and over-shoots voltage, in which the static memory monitor may seek to discard, and this discarding may be achieved from outside the system.

In various implementations, the static memory monitor described herein may address some of the above constraints. For instance, bitcells may be arranged in an array configuration, and this may ensure that some of the constraints above are automatically met. Also, multiple bitcells may be activated for read monitoring and/or for write monitoring, wherein local variations are averaged, so as to meet some other constraints above. This may be possible because the bitcells may be coupled in an array configuration, so as to thereby make the static memory monitor more efficient.

FIG. 3B-1 shows a diagram of memory circuitry 300B-1 that is adapted for sensing read performance. The memory circuitry 300B-1 may be implemented with bitcells for random access memory (RAM), e.g., including static RAM (SRAM) or other types of memories, and the memory circuitry 300B-1 may refer to an SRAM read speed sensor. In some instances, the memory circuitry 300B-1 may be implemented and used as a memory structure having an array of memory cells 304B that operate as a performance monitor that provides an output oscillating signal, such as, e.g., OUT, with repetitive switching having a frequency that is correlated to a read performance of the memory cells (bitcells BC1, BC2, . . . , BCM) based on at least one of transistor properties and operating conditions of the memory cells. The performance monitor may operate as a read sensor or read performance monitor that may support variable voltages applied to data storage (e.g., 104A of FIGS. 1A-1B) that allows for increased operating voltages for increased performance and power of the data storage and/or for lowered operating voltages for reduced performance and power of the data storage.

As shown in FIG. 3B-1, the memory circuitry 300B-1 may include the array 304B of bitcells (BC1, BC2, . . . , BCM), row circuitry 308B, bitline pairs (BL, BLB), control circuitry 312B, and column circuitry 314B. The memory circuitry 300B-1 may include one or more wordlines (WLs) arranged in rows (rows_1, row_2, . . . , row_N), and the array 304B of bitcells (BC1, BC2, . . . , BCM) may be coupled to the row circuitry 308B via a number (N) of wordlines (WL1, WL2, . . . , WLN). In some instances, N=4. The memory circuitry 300B-1 may include one or more bitline pairs (BL, BLB) arranged in columns (col_1, col_2, . . . , col_M), and the array 304B of bitcells (BC1, BC2, . . . , BCM) may be coupled to the column circuitry 314B via the one or more bitline pairs (BL, BLB). The control circuitry 312B may receive one or more input signals, such as, e.g., the enable signal (EN) at an input pin, the reset signal (RSTN) at an input pin, and a bitline signal (BL). The BL in this embodiment may be the BL for each column shorted together in order to get an averaging effect across multiple bit cells. The control circuitry 312B may provide a timing signal (GTP) to the row circuitry 308B and/or the column circuitry 314B, which may be used as a precharge signal (PCH) via one or more inverters.

The control circuitry 312B includes logic circuitry (G0) that receives the bitline signal (BL) at a first input (A). This BL signal may connect all of the bitlines (BLs) for col_1 to col_M to average the delay. The logic circuitry (G0) receives the enable signal (EN) at a second input (B). The logic circuitry (G0) receives a reset signal (RST) at a third input (C) via an inverter, wherein the inverter receives and inverts a complementary reset signal (RSTN) so as to provide the reset signal (RST). Also, the logic circuitry (G0) provides the timing signal of G0 (GTP) based on a logical application of inputs (A·B+C). The timing signal (GTP) is buffered (e.g., double-inverted) to provide the output signal OUT at an output pin. The timing signal (GTP) and a complementary timing signal (NGTP) are also provided to the row circuitry 308B.

The row circuitry 308B is coupled to the bitcell circuitry (BC1, BC2, . . . , BCM) in rows (row_1, row_2, . . . , row_N) and includes flip-flop circuitry (FF1, FF2, . . . ,FFN) that receives the complementary reset signal (RSTN), and the complementary timing signal (NGTP) as a clock signal (CLK). The flip-flop circuitry (FF1, FF2, . . . ,FFN) has a data input (D) and a data output (Q), wherein the data input (D) of each flip flop is coupled to the data output (Q) of a previous flip-flop. In reference to FIG. 3B-1, the output Q of FFN will go to D of FF[N−1], and so on, and the output of FF1 will go to D of FFN thus forming a circular loop. In some instances, the number (N) of flip-flops (FF) is 256. For instance, the output Q of the flip-flop FF1 is coupled to the input D of the flip-flop FF256, thus making the series of flip-flops act like a circular chain. The reset signal (RSTN) of the FF256 will set the output to logic "1", while it will reset the output of all other flip-flops (FF1, . . . , FF255) to logic "0". This will ensure that after the reset operation, only one flip-flop is having a logic "1", which will ensure that only one of the wordlines is on during sensor operation The row circuitry 308B includes logic circuitry (G1, G2, . . . , GN) that receives the timing signal (GTP) from G0 at a first input (A). The logic circuitry (G1, G2, . . . , GN) receives a corresponding output signal (Q) from corresponding flip-flop circuitry (FF1, FF2, . . . , FFN) at a second input (B). The logic circuitry (G1, G2, . . . , GN) receives the reset signal (RST) from at a third input (C). Also, the logic circuitry (G1, G2, . . . , GN) provides wordline signals (WL1, WL2, . . . , WLN) based on a logical application of inputs (A·B+C).

The column circuitry 314B is coupled to the bitcell circuitry (BC1, BC2, . . . , BCM) in columns (col_1, col_2, . . . , col_M) and receives the reset signal (RST) at the gate of corresponding first transistors T1 (e.g., NMOS) and a precharge signal (PCH) at the gate of corresponding second transistors T2 (e.g., PMOS). As shown, the precharge signal (PCH) may be a buffered signal, such as, e.g., a double-inversion of the timing signal (GTP). The buffered signal may cause a propagation delay. The first and second transistors T1, T2 are coupled together in series between a supply voltage (VDD) and ground (GND, VSS). Also, a bitline signal (BL) is provided from a node that is disposed between the first and second transistors T1, T2. The column circuitry 314B includes third transistors T3 (e.g., PMOS) that are coupled between the supply voltage (VDD) and complementary bitline (BLB). Note that just as multiple bit lines (BL) are coupled together, so there are multiple complementary bitlines (BLB) that are coupled together. However, in alternate implementation, the BLB for individual columns can be separate.

The array 304B of bitcells (BC1, BC2, . . . , BCM) receives a voltage signal from the supply voltage (VDD) via power gates PT (e.g., PMOS), which are activated based on the reset signal (RST). In some cases, the power gates PT may enable write operation in reset mode, and the power gates may reside in the column circuitry 314B. In reset mode (when RSTN=0 and RST=1), the power gate PT will switch off the power supply of the bitcells. In addition, all the wordlines will be activated during reset operation. In some instances, all WL may go high because of input C which is coupled to RST, which is 1. When coming out of reset (i.e., RST), RSTN=1, RST=0, then the active inputs are A and B. One input is like a clock, the other is like a WL selection. Hence, only 1 WL is selected at a time. Overall, this will enable the write driver T1 to write to the entire column, thus resetting the contents of all the bitcells. This is important to have predictive read during sensor operation. The bitcells (BC1, BC2, . . . , BCM) are arranged in a number (M) of columns (col_1, col_2, . . . , col_M) and a number (N) of rows (row_1, row_2, . . . , row_N). The bitcells (BC1, BC2, . . . , BCM) have a wordline signal (WL), a bitline signal (BL), and a complementary bitline signal (BLB). The bitcells (BC1, BC2, . . . , BCM) receive the wordline signal (WL) from corresponding logic circuitry (G1, G2, . . . , GN) via corresponding wordlines (WL1, WL2, . . . , WLN). The bitcells (BC1, BC2, . . . , BCM) also receive the bitline signals (BL/BLB) from the column circuitry 314B.

In some implementations, at least one of the wordlines (WL1, WL2, . . . , WLN) and the bitlines (BL/BLB) may be sequenced so that the output oscillating signal (e.g., OUT) has a repetitive periodic pattern. The output oscillating signal (e.g., OUT) may be implemented as the first output oscillating signal 110A of FIG. 1B. The sequence of at least one of the wordlines (WL1, WL2, . . . , WLN) and the bitlines (BL/BLB) provides for at least one of a predetermined read order of bits. In this instance, the predetermined read order of bits allows for fabrication of the memory structure 300B-1 independent of the at least one of the row circuitry 308B (e.g., when operating as a row decoder) and the column circuitry 314B (e.g., when operating as a column decoder, see FIG. 3C-1). In some instances, the term "decoder" refers to the structure of 308B-1 such that it determines, based on its inputs, the sequence of rows that are accessed. As such, the memory structure 300B-1 functions similar to a RAM decoder. However, since there is no supplied address, and since the sequence is predetermined, there is no random access to any given row. In some instances, the memory structure 300B-1 may only work with row sequencing, and the memory structure 300C-1 may only work with column sequencing, and the memory circuitry 300A may work as either or both a row decoder or a column decoder. It should be noted that the G1-GN structures and the FF1-FFN structures may operate as a row decoder. However, the use of a decoder should not be taken literally, since there is no random access dependent on an address supplied to the memory structure 300B-1.

In some implementations, at least two of the wordlines (WL1, WL2, ..., WLN) may be coupled together and/or at least two of the bitlines (BL/BLB) may be coupled together so as to provide an averaging of the frequency of the output oscillating signal (e.g., OUT) due to multiple memory cells (i.e., bitcells BC1, BC2, ..., BCM) being activated during a same time period. In other implementations, there may be an embodiment that allows both wordlines coupled together and bitlines coupled together, but wordlines should not be coupled to bitlines. Also, the averaging of the frequency reduces the impact of local memory cell to memory cell variation so as to reduce jitter and correlate more to an average memory cell performance rather than indicate the memory cell to memory cell variation. Further, in some implementations, a measurement of the frequency of the output oscillating signal (e.g., OUT) may include a measurement of jitter that refers to a variation from cycle to cycle of a period of the frequency. In this instance, the variation may correlate with a memory cell performance on a fine level, and the variation may correlate to random process variation, such as, e.g., line edge roughness or random dopant fluctuation, affecting electrical characteristics from memory cell to memory cell. In some instances, process variation may cause electrical characteristics of a cell to vary, thus causing performance of a memory circuit design to change.

In some instances, a height of the memory circuitry 300A may be increased to increase sensitivity of the read sensor. In various instances, height may refer to more rows and/or capacitance added to bitlines to increase bitline capacitance. This is important to ensure that the oscillating frequency of the OUT is a strong function of the Bitcell read current. In addition, the periphery devices can use lower voltage threshold (Vth) devices to achieve lesser sensitivity of the oscillation frequency to the periphery devices. Use of separate enable (EN) and reset (RSTN) pins prevents voltage gate stress, such as bias temperature instability (BTI) effects, on the wordlines (WLs) when the sensor is not enabled. The enable (EN) pin may be used as a power gate of the sensor for leakage reduction when not used. Also, logic optimization may be improved, e.g., a bitline-wordline path (BL-WL path) may be reduced from 4 inverter stages to 2 inverter stages.

In reference to FIG. 3B-1, standard static 6T bitcells may be used. However, various other static bitcells may be used, such as, e.g., a larger 8T bitcell, depending on the type of working memory 104A. In some instances, all bitcells may be initialized to a logical zero at an internal node of the storage element (cored) by pulling down on the BL bitline through the NFET gate T1 when the reset (RST) signal is going high, with the GTP going high, and the wordline WL subsequently going high. The term "cored" may refer to an internal node of a storage element (e.g., a latch). This is one case that the WLs all go high at one time. The initialization of the bitcells may be aided by turning off the power gates (PT) which provides power to the 6T bitcells. In some cases, the nodes write much easier when VDD on the bitcell is low. In some instances, "writing" may refer to storing a value in a cell, which may require an applied VDD at the time the write completes (as in when the passgate turns off). After all the bitcells are initialized to the same value (cored=0), then the data is read out of the BL bitline only. This may occur one row at a time, as the rows are sequenced to switch one row in each subsequent cycle through the flip-flops (FFs). In this instance, the columns may have all the BL bitlines tied together, and they may feed a circuit, G0, that causes the output OUT to switch high after a logical zero is read out of the bitlines. This provides the averaging effect across all of the columns (M bitlines) in a row. After the WL is switched off, GTP goes low, which may cause the precharge signal (PCH) to go low, and this may restore the BL to logical one. GTP going to logical zero may also cause the output, OUT, to fall to logical zero. This may repeat for each wordline, and the sequence may continue and repeat.

Also, in reference to FIG. 3B-1, a fundamental principle that is applied to the read speed sensor is to set a wordline (WL) that discharges a bitline (BL), and discharge of the BL resets the WL and precharges the BL. This then triggers the WL again, and this continues to create an output which behaves like an oscillator. To make this into a practical implementation and to cover some constraints described herein above, an array configuration of bitcells may be used to achieve the various schemes and techniques described herein. For instance, in reference to schemes and techniques for adjusting bitline capacitance, a MOSFET capacitor may be used, a Metal-Oxide-Metal (MOM) capacitor may be used, a Metal-Insulator-Metal (MIM) capacitor may be used, or a tall BL may be used, any of which may lead to an increased load on the BL. The purpose of increasing capacitance is to ensure that the large part of the ring oscillator delay is coming from BL discharge. This may ensure that the read speed monitor is a strong function of bitcell read current, and a number of rows may vary, but 256 or 512 may be acceptable.

The tall BL may lead to multiple rows, and the WL selection may be sequenced so that all the rows connected to a BL are activated one at a time. This leads to the averaging effect of the BL discharge time as the bitcells in few rows may be faster leading to faster transition on the BL, which may further lead to higher output frequency. Few other rows may have slower bitcells, leading to lower output frequency. If the rows are then sequenced in some way, an average output frequency, which may be determined by counting the number of positive switches in a fixed period of time, may be a measure of a global operating point including the global process, average voltage and the temperature, which is what is desirable. In some cases, the OUT signal may provide a jitter, which may be a function of local variations and may be used in some applications. Also, an important benefit of this configuration is that the bitcell monitoring is done in the same way in which the bitcell operates in a read operation in a static memory instance.

Further, the sequencing should be practical, and using a shift register chain may provide a select signal for a respective row. Only one register in this chain is selected at one time, and any derivative from the monitor output signal may be used as a clock for the shift register. With one falling edge of the WL, the rising edge of the shift register clock may be generated, and the WL select signal may shift from one row to the adjacent row. When a next rising edge of global timing pulse (GTP) occurs, the adjacent WL may be selected, and when the last WL is reached, the first WL is returned to. Also, the number of columns in the array may be kept small, so as to reduce power. For instance, with 4 columns, the WL may activate, and all 4 BL will discharge. In this instance, all 4 BLs may be used by connecting them (shorting them), and then a single BL signal may be used to reset the GTP. An advantage may refer to averaging of the local variations, and the BL discharge power of the other 3 columns may be used instead of wasting power. In some instances, 1 or 2 column(s) may be used, but it may be better to use more than 1 column to improve array area efficiency, and in other instances 8 columns may be used, but this may increase power. Hence, fewer columns may be more efficient. In general any number of columns may be used with the variation that adding columns results in more averaging at the cost of additional power. In some instances, a minimum number of rows and columns may be required to form a bitcell array, and as such, this may require the addition of more columns in a layout even if they are not electrically connected.

In reference to using a read sensor, it may be necessary to reset the bitcells to a desired state. In some cases, this may be achieved using a reset mode, where all WLs are activated, and all BLs are pulled to 0, and all BLBs are already pulled to 1. One issue remains in that many rows (e.g., 512 rows) may be written with a single write driver. In a worst case scenario, all 512 bitcells may pull-up, and PMOS transistors in the bit cells may fight against the NMOS write driver. This may make a write difficult. As a solution, the power supply of the bitcell may be switched-off in reset mode. This may be achieved using power gates PT (e.g., PMOS transistors) as shown in FIG. 3B-1. In this instance, the pull-up PMOS transistors may not receive any power, and hence, they may flip logic states. Similarly, the shift registers may reset so that only one of them has a logical 1 state and all others have a logical 0 state. This may be achieved by resetting the top register to a logical 1 state and all other registers to a logical 0 state. Further, an enable (EN) pin may be used, wherein if the enable (EN) pin is at a logical 0 state, then the static memory monitor may cease to operate, and a static output may then be provided. This technique may be used to save power when the static memory monitor is not needed. In some instances, the read speed sensor may have read assist being applied, and also, write assist may be applied in the write speed sensor.

FIG. 3B-2 shows the timing waveform 300B-2 that corresponds to the bitcell delay configuration 300B-1 for the read sensor. In some implementations, the FF256 (with N=256) would have Q[256]=1 when RSTN=0 (during reset), and all other FF1-FF255 will have their respective Q set to 0 when RSTN=0. In this instance, only 1 of all the flops (i.e., FF256) is set to "1" during reset phase. Thereafter, that "1" will propagate when the sensor is active. Also, when N=256, the wordline (WL1-WL256) sequencing order will be WL256, WL255, WL254, ..., WL2, WL1, WL256, WL254, ..., WL2, WL1, WL256, ..., etc., when N=256. In some instances, the output signal (OUT) and the precharge signal (PCH) may be the same as the timing signal (GTP) after being delayed.

Some key design principles of the memory circuitry 300B-1 may include one or more of the following. The memory circuitry 300B-1 provides a technique for using bitline discharge as a reset for a ring oscillator. The sensor architecture may include peripheral circuitry (e.g., row decoder, column input/output (IO) and control). At least one wordline (WL) is activated at a time to reduce power. The technique involves use of shift register based WL selection. The technique provides enable and reset functionalities along with power-down features and provides testability add-on for a shift register chain.

Also, some advantages of the memory circuitry 300B-1, or 300C-1 may include one or more of the following. The process layers that form the transistor devices and determine their electrical properties, which may be referred to as front-end layers (FEOL), may be similar or identical between the sensor bitcells (which may be modified as in the write example shown in FIG. 200B-1 and FIG. 300C-1) and the bitcells for data storage purposes. FEOL may include all CMOS process layers up to an including the contact level. The layers that may provide the connection modification of the bitcells outlined above may be interconnect levels above contact, such as, e.g., metal and vias. There may be no change in the layout of front end layers (FEOL) that affect the electrical characteristics, or strengths, of transistors used within the memory bitcell for scalability to any technology node. The sensors may operate under the "exact" conditions as SRAM. The technique provides repetitive discharging of the bitline. The technique provides output frequency as a strong function of bitcell read current.

FIG. 3C-1 shows memory circuitry 300C-1 that is adapted for sensing write performance. The memory circuitry 300C-1 may be implemented with memory bitcells for RAM, e.g., including static RAM (SRAM), and the memory circuitry 300C-1 may refer to an SRAM write speed sensor. Also, the memory circuitry 300C-1 may refer to a technique for management of the internal node related to BLB (ncored). In some instances, the memory circuitry 300C-1 may be implemented as a memory structure having an array of memory cells 304C (or bitcells) that operate as a performance monitor that provides an output oscillating signal, such as, e.g., OUT, with repetitive switching having a frequency that is correlated to a write performance of the memory cells (bitcells BC1, ..., BCM) based on at least one of transistor properties and operating conditions of the memory cells. The performance monitor may operate as a write sensor or write performance monitor that supports AVS.

As shown in FIG. 3C-1, the memory circuitry 300C-1 may include the array 304C of bitcells (BC1, ..., BCM), row circuitry 308C, bitline pairs (BL, BLB), control circuitry 312C, and column circuitry 314C. In some cases, each bitcell in the array 304C of bitcells (BC1, ..., BCM) may be implemented with the bitcell 214 in FIG. 2C. The memory circuitry 300C-1 may include one or more wordlines (WLs), and the array 304C of bitcells (bitcells BC1, ..., BCM) may be coupled to the row circuitry 308C via a number (N) of wordlines (WL1, WL2, ..., WLN). The memory circuitry 300C-1 may include the one or more bitline pairs (BL, BLB), and the array 304C of bitcells (bitcells BC1, ..., BCM) may be coupled to the column circuitry 314C via the one or more bitline pairs (BL, BLB). The control circuitry 312C may receive one or more input signals, such as, e.g., the enable signal (EN) and the reset signal (RSTN). The control circuitry 312C may provide a timing signal (GTP) to the row circuitry 308C and/or the column circuitry 314C.

The control circuitry 312C includes logic circuitry (e.g., a NAND gate, inverters, transistors, etc.) that are arranged to receive an enable signal (EN) and a global data signal (GDL) and provide a precharge signal (npch) to the column circuitry 314C via one or more inverters. The logic circuitry (e.g., a NAND gate, inverters, transistors, etc.) may be arranged to provide the timing signal (GTP) to the row circuitry 308C. Also, the logic circuitry (e.g., a NAND gate, inverters, transistors, etc.) may be arranged to provide the output oscillating signal, such as, e.g., OUT.

The row circuitry 308C is coupled to the bitcell circuitry (BC1, . . . , BCM) in rows (row_1, row_2, . . . , row_N) and passes the timing signal (GTP) to the bitcell circuitry (BC1, . . . , BCM) via corresponding wordlines (WL1, WL2, . . . , WLN). There is no requirement that the number of rows be 4 exactly, it could be more or less and does not have to be a binary number. In this embodiment all the wordlines are driven by GTP, so they are connected together. This gives a similar averaging effect for this embodiment that was seen in FIG. 3B-1, just in this embodiment, FIG. 3C-1, the wordlines are coupled together rather than in FIG. 3B-1 the BLs were coupled together. In some implementations, as shown in FIG. 3C-1, the wordlines (WL1, WL2, . . . , WLN) are coupled together. In other implementations, the bitlines (BL/BLB) are coupled together. In some other implementations, the wordlines (WL1, WL2, . . . , WLN) are coupled together, and the bitlines (BL/BLB) are coupled together, but wordlines are never coupled to bitlines.

The column circuitry 314C is coupled to the bitcell circuitry (BC1, . . . , BCM) in columns (col_1, col_2, . . . , col_N) and receives the complementary reset signal (RSTN) as an input to the flip-flops and the precharge signal (npch) as a clock signal (CLK) at corresponding column flip-flops (FF1, . . . FFM). As shown, the control circuitry 312C includes a NAND gate 322, and the precharge signal (npch) is a double-inversion of the NAND gate 322 output. The flip-flop circuitry (FF1, . . . , FF64), and the number of FFs may be any other number than 64 as well) has a data input (D) and a data output (Q), wherein the data input (D) of each flip flop is coupled to the data output (Q) of a previous flip-flop. Also, for each column (col_1, . . . , col_M), the data output (Q) of each flip-flop (FF1, . . . , FFM) is provided to a corresponding logic gate (e.g., NAND gates 320-1, . . . , 320-M), wherein each logic gate receives the signal (GTP) and the Q output signal in corresponding columns (col_1, . . . , col_M). Also the data output (Q) of the first FF is provided to the input of FF2, such that the output (Q) of FF[M−1] is applied to the input (D) of FFM. The last flip-flop (FFM) provides another Q data output (as ywsel[M] signal) to the data input (D) of the first flip-flop (FF1). In some instances, the D of FFM is coupled to the Q of FF[M−1]. Further, the column circuitry 314C has a precharge transistor PC (e.g., NMOS) that is coupled between the complementary bitline (BLB) and ground (GND, VSS) and that is activated with the precharge signal (npch). This occurs for each complementary BLB. The column circuitry 314C also has a global data line transistor T0 for every column (e.g., NMOS) that couples the global data line (GDL) to ground (GND, VSS) when activated by the complementary bitline (BLB).

The array 304C of bitcells (BC1, . . . , BCM) are arranged in a number (M) of columns (col_1, . . . , col_M) and a number (N) of rows (row_1, . . . , row_N). The bitcells (BC1, . . . , BCM) have a wordline signal input (WL), a bitline signal input (BL), and a complementary bitline input (BLB). The bitcells (BC1, . . . , BCM) receive the timing signal (GTP) from the control circuitry 312C at the wordline signal input (WL). The bitcells (BC1, . . . , BCM) also receive the bitline signals (BL/BLB) from the column circuitry 314B. In some implementations, the wordlines (WL1, . . . , WLN) may be coupled together. In other implementations, the wordlines (WL1, . . . , WLN) may be coupled separately in a different manner.

In some implementations, in reference to FIG. 1B, at least one of the wordlines (WL1, WL2, . . . , WLN) and the bitlines (BL/BLB) may be sequenced so that the output oscillating signal (e.g., OUT) has a repetitive periodic pattern. The output oscillating signal (e.g., OUT) may be implemented as the second output oscillating signal 110B of FIG. 1B. The sequence of at least one of the wordlines (WL1, WL2, . . . , WLN) and the bitlines (BL/BLB) provides for at least one of a predetermined write order of bits. In this instance, the predetermined write order of bits allows for fabrication of the memory structure 300C-1 independent of the at least one of the row circuitry 308A (e.g., when operating as a row decoder) and the column circuitry 314C (e.g., when operating as a column decoder).

In some implementations, at least two of the wordlines (WL1, WL2, . . . , WLN) may be coupled together and/or at least two of the bitlines (BL/BLB) may be coupled together so as to provide an averaging of the frequency of the output oscillating signal (e.g., OUT) due to multiple memory cells (i.e., bitcells BC1, . . . , BCM) being activated during a same time period. In the embodiment of FIG. 3C-1, four wordlines are coupled together which causes each of the 4 bit cells in the selected column to be active at the same time, which causes an average switching on the signal BLB after the bit cells have been successfully written with Cored=0 Also, the averaging of the frequency reduces the impact of memory cell to memory cell variation so as to reduce jitter and correlate more to an average memory cell performance rather than indicate the memory cell to memory cell variation. Further, in some implementations, a measurement of the frequency of the output oscillating signal (e.g., OUT) may include a measurement of jitter that refers to a variation from cycle to cycle of a period of the frequency. In this instance, variation may correlate with a memory cell performance on a fine level, and the variation may correlate to a random variation of the memory cell performance from memory cell to memory cell.

In some implementations, the memory circuitry 300C-1 may provide a short-wide instance with one or more or all wordlines (WL) activated and with columns activated one by one. In this instance, a short instance advantage may refer to using only four wordlines (WLs) so as to assist with reducing power and thus ensuring that a write operation occurs through a write driver. Also, in this instance, an advantage of having multiple columns coupled together may refer to an averaging effect of write time, and un-selected columns do not waste power. Further, in some cases, to enable improved write operations if required, the bitline(s) may be driven using an inverter, or in other cases, write assist may be applied.

In reference to FIG. 3C-1, modification of the 6T bitcells as shown in FIG. 2C may allow the output of the ncored node to be distributed to the complementary bitline (BLB). This is enabled by shorting the source to the drain of the WL NMOS transistor (NFET) coupled to the BLB bitline. In some cases, a via1 may be used to accomplish this short. In some instances, all wordlines may be activated, and there may be no sequence of wordlines; however, there may be no decoding since all wordlines are enabled at the same time. The bit lines are sequenced one column at a time during the write, so there is no random access here either. In some cases, a random number generator may be used to allow selection of the sequence of accessing different columns.

In some instances, the BLB bitline may be restored to a logical zero, during a reset of the array back to a standard value prior to a write, and in this instance, the BL bitline may be forced to a logical one. The BLB bitline may be restored to a logical zero, so that when a logical zero is written on the BL bitline side into the cored memory node, the ncored memory node may rise to VDD, and the output of the bitcell on the BLB bitline may rise to VDD. As such, this design may use VDD lowering in the bitcell to facilitate the write of the bitcell during the reset time.

Also, in reference to FIG. 3C-1, the write speed sensor may be based on similar principles as the read speed sensor. For instance, when a WL is switched on and the BL is discharged through NAND 320, and the bitcell flips logic state. Thus, a key point to address is how to observe the bitcell flip logic state. For this technique, as shown in FIG. 2C, a metal short 216 is provided between a pass gate source-drain (T11) from the side that is opposite to the one used for the write operation. So, in this instance, a write is achieved through the discharge of the BL. As a result, the cored node goes to a logic 0 state, and the ncored node goes to a logic 1 state. As shown in FIG. 2C, this may be achieved with the metal short 216 coupled between the ncored node and the BLB (bitline bar). In this instance, the ncored logic state may be observed through the BLB. Note that in a standard 6T bitcell layout, this technique may be achieved by adding a via1 between the BLB (metal 2) and the ncored node (metal 1) in a typical bitcell. Similar techniques of providing a short by adding a via is possible for multiple layout topologies in multiple technologies.

In addition, an array configuration for write speed sensing may be achievable as shown in reference to FIG. 3C-1. In this instance, the memory bitcell array has a small number of rows. Since the BLB and ncored may be shorted, the load on ncored may be reduced to mimic the bitcell electrical behavior, and this may be achieved by shorting the ncored-BLB for all rows of a single column, while all WLs are selected at the same time. When all WL are selected, then all pull-up PMOS transistors are driving the BLB node, and the BLB node capacitance is amortized over all pull-ups connected in the row. This causes the averaging effect of N(4 in this embodiment) bit cells all being turned on in the same column at the same time. Although any number of rows may be used, the number of WL (or rows) may be limited to 4. In this instance, power of the write operation is limited, and also this technique allows the write driver in the column circuitry 314C to write all of the 4 bitcells in parallel.

In some implementations, the principle of sequencing WLs in the read speed sensor may be applied to sequencing the BLs in the write speed sensor. For instance, only one column may be written at a time, which may save power. In this instance, one BL is pulled to low, and then all 4 WLs are pulled high, which causes the write operation to occur in all rows for a single column. As such, the BLB goes high, which means that the write has occurred. As such, a global data line (GDL) is pulled down by the selected column BLB (wired-OR), and also, the GDL is pulled up in the control region. The selected column BLB will now pull down the GDL, which will activate the reset operation, and the GTP/WL will be pulled back to a logical 0 state. In the FIG. 3C-1 embodiment there are three inversions from GTP then going low to pulling GDL high by the PFET whose drain is attached to GDL. This feedback path will then cause GTP to go high again through NAND 322 and the following inverter. This is an example of a self-resetting circuit. Any number of techniques may be employed to cause the circuit to oscillate. Slightly different circuits might be self-timed rather than self-resetting. Any of these sort of techniques are available to cause the reset to occur, and then start the access to the next column in the sequence. The shift register receives a clock (npch), the select moves to the adjacent column, and the BLB will be pulled to a logical 0 state. This may reset the bitcell contents. Since there is a metal short 216 between ncored and BLB, the ncored will be logical 0 when the WL is logical 0. As such, the control circuitry will issue another pulse, and this time, the write operation will happen in the adjacent column. Note that there is no need for a reset operation as in the case of read speed sensor, and the bitcell may be in a reset state when not selected. Further, the enable functionality for the write speed sensor may be the same as for read speed sensor.

One additional advantage of the using the modified write bitcell shown in FIG. 2C is that the WL signal does not have to be high when the bitcell value is being returned to cored switching to a one (1). Since BLB is shorted to Ncored in the modified write bit cell (FIG. 2C) then when the BLB is pulled low, this causes Cored to switch to a one. This is independent of the WL being activated, since T11 is always on and not dependent on the WL being activated to turn on. If the standard 6T (or similar) bit cell is used, then the WL must be active while both BL and BLB are individually pulled low, writing a zero to Cored and then re-writing Cored to a one to complete the reset of the bitcell(s) to its original state.

FIG. 3C-2 shows the timing waveform 300C-2 that corresponds to the bitcell delay configuration 300C-1 for the write sensor. In some implementations, the FFM would have Q=1 when RSTN=0 (during reset), and all other FF will have Q=0 when RSTN=0. In this instance, only 1 of all the flip-flops (FFs) is set to "1" during reset phase. Thereafter, that "1" will propagate when the sensor is active. Also, the BL sequencing order will be BL1, BL2, ... BL62, BL63, BL64, BL1, ... BL62, BL63, BL64, BL1, ... for M=64, starting from 1. In some instances, the output signal (OUT) may be the same as the timing signal (GTP) after being delayed.

Some key design principles of the memory circuitry 300C-1 may include one or more of the following. The memory circuitry 300C-1 provides a technique for using a via1 layer to make ncored visible as a bitline. The technique may provide sensor architecture for peripheral circuitry (e.g., row-decoder, IO and control). One column may be activated at a time to reduce power. The technique may use shift register based column selection, and the technique may have reset functionality along with power-down features. The technique may be implemented in combination with a write assist technique that may be embedded in the IO block 312C if the bitcell is not write-able. The technique may provide for testability with an add-on for shift register chain.

Also, some advantages of the memory circuitry 300C-1 may include one or more of the following. The memory circuitry 300C-1 may be implemented as a sensor operating in "almost exact" conditions as actual SRAM. The memory circuitry 300C-1 may provide an output frequency which is a strong function of the bitcell write speed. The memory circuitry 300C-1 may use less power with less wasted power, and unselected columns do not consume any power. There is a tradeoff between the number of rows connected together for averaging and the minimum power. The more rows that are connected together will improve averaging at the expense of power.

In some implementations, at least one wordline may be activated for the read function or the write function. The read bitcell array may use a static memory bitcell design, such as, e.g., a 6T SRAM bitcell commonly used in industry. Other static memory bitcell designs may also be used. The write bitcell array may use a static 6T memory bitcell design. The bitline output may be shorted together across multiple columns, wherein this technique incorporates shorting the bitlines together, which may cause an averaging function where output performance of a group of bitlines gives an average performance of one or more or all the bitcells accessed during this one cycle. The read bitline performance may be single rail, wherein one embodiment may be a single rail read.

Further, the write function for the read memory array may be through a single wordline per cycle, or there may be a function that allows the write to happen in a single cycle to one or more or all multiple bitcells. For the read memory array or the write memory array, various read and write assist techniques may be used. These techniques may give added functionality depending on the process being used and the temperature and voltage conditions required. This case may include negative bitline write assist, VDD lowering, and or shaping of the wordline to enhance read and writeability. Generally, any lack of an assist feature being shown in an implementation does not eliminate that feature from being used in an implementation.

Throughout these embodiments the feature of sequencing the order that the bitcells are read or written or both is required. For the sequencing there is no general address that is supplied, and thus no decoding. This aids in reduced complexity, area, and power. This sequence may be determined by the hardware design shown in FIGS. 3B-1 and 3C-1, or by a separate input stream.

Described herein are various implementations of an integrated circuit. The integrated circuit may include a first memory structure disposed in a first area of the integrated circuit, and the first memory structure may have first memory cells with first transistors. The integrated circuit may include a second memory structure disposed in a second area of the integrated circuit that is different than the first area, and the second memory structure may have second memory cells with second transistors that are separate from the first transistors. The second transistors of the second memory cells may be arranged to provide an output oscillating frequency for detecting variation of performance of the first transistors of the first memory cells.

Described herein are various implementations of an integrated circuit. The integrated circuit may include a first memory structure operating as data storage. The integrated circuit may include a second memory structure operating as a performance sensor that selectively provides an output oscillating frequency based on characteristics associated with different operating conditions. The first memory structure and the second memory structure have memory cells that are fabricated simultaneously.

Described herein are various implementations of a memory structure. The memory structure may include an array of memory cells that operate as a performance monitor that provides an output oscillating signal with repetitive switching having a frequency that is correlated to at least one of a read performance and a write performance of the memory cells based on at least one of transistor properties and operating conditions of the memory cells. The performance monitor activates a sequence of at least one of wordlines and bitlines so that the output oscillating signal has a repetitive periodic pattern.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
a first memory structure disposed in a first area of the integrated circuit, the first memory structure having first memory cells with first transistors; and
a second memory structure disposed in a second area of the integrated circuit that is different than the first area, the second memory structure having second memory cells with second transistors that are separate from the first transistors,
wherein the second transistors of the second memory cells are arranged to provide an output oscillating frequency for detecting variation of read performance and write performance of the first transistors of the first memory cells,
wherein the write performance is associated with a write current of the first transistors of the first memory cells.

2. The integrated circuit of claim 1, wherein the output oscillating frequency is based on performance of the second transistors of the second memory cells.

3. The integrated circuit of claim 2, wherein the performance of the second transistors of the second memory cells is based on one or more operating conditions that refer to detecting the variation of at least one of process, voltage and temperature of the second transistors of the second memory cells.

4. The integrated circuit of claim 1, wherein the first transistors and the second transistors are fabricated simultaneously with similar transistor properties.

5. The integrated circuit of claim 1, wherein the second memory structure provides the output oscillating frequency that is correlated to at least one of the read performance and the write performance of the first memory cells.

6. The integrated circuit of claim 5, wherein a modification of the second memory cells enables improved measurement of the write performance.

7. An integrated circuit, comprising:
a first memory structure operating as data storage; and
a second memory structure operating as a performance sensor that selectively provides an output oscillating frequency associated with read operations and write operations based on characteristics associated with different operating conditions, the write operations comprising at least a write current,
wherein the first memory structure and the second memory structure have memory cells that are fabricated simultaneously.

8. The integrated circuit of claim 7, wherein the second memory structure provides the output oscillating signal with repetitive switching having a frequency that is correlated to at least one of a read performance and a write performance of the memory cells of the second memory structure based on operating conditions of the memory cells.

9. The integrated circuit of claim 8, wherein a modification of the memory cells for the second memory structure enables improved functionality and representation of the write performance, and wherein the first memory structure and the second memory structure have a same transistor front end layout and have substantially a same transistor strength.

10. The integrated circuit of claim 7, wherein the second memory structure comprises at least one of multiple wordlines and multiple bitline pairs, and wherein a sequence of at least one of the multiple wordlines and the multiple bitline pairs is activated so that the output oscillating signal has a repetitive periodic pattern.

11. The integrated circuit of claim 7, wherein the output oscillating frequency is used to alter performance of the first memory structure.

12. The integrated circuit of claim 7, wherein the second memory structure selectively provides the output oscillating frequency as a first output oscillating frequency that is associated with read performance of read operations.

13. The integrated circuit of claim 7, further comprising a processor or a controller that monitors the output oscillating frequency from the second memory structure.

14. The integrated circuit of claim 13 wherein the processor or the controller adjusts at least one of a performance and power of the first memory structure based on the output operating frequency received from the second memory structure.

15. The integrated circuit of claim 14, wherein the supply voltage (VDD) or settings for internal timing margins or read/write assist are changed for the first memory structure so as to cause a change in at least one of performance and power.

16. An integrated circuit, comprising:
a first memory structure operating as data storage; and
a second memory structure operating as a performance sensor that selectively provides an output oscillating frequency based on characteristics associated with different operating conditions,
wherein the first memory structure and the second memory structure have memory cells that are fabricated simultaneously; and
wherein the second memory structure comprises multiple wordlines and multiple bitlines, and wherein at least two of the wordlines are coupled together or at least two of the bitlines are coupled together so as to provide an averaging of the frequency of the output oscillating signal due to multiple memory cells being activated during a same time period, and wherein the averaging of the frequency reduces impact of the memory cell to memory cell variation so as to correlate more to an average memory cell performance, or
wherein the second memory structure selectively provides the output oscillating frequency as a first output oscillating frequency that is associated with read operations, and wherein the second memory structure selectively provides a second output oscillating frequency that is associated with write operations, or
wherein the second memory structure selectively provides the output oscillating frequency as a first output oscillating frequency that is associated with read performance of read operations and further comprising a third memory structure that operates as a separate performance sensor that selectively provides a second output oscillating frequency that is associated with write performance of write operations and that is different than the first output oscillating frequency.

17. A memory structure, comprising:
an array of memory cells that operate as a performance monitor that provides an output oscillating signal with repetitive switching having a frequency that is correlated to at least one of a read performance and a write performance of the memory cells based on at least one of transistor properties and operating conditions of the memory cells, wherein the performance monitor activates a sequence of at least one of wordlines and bitlines so that the output oscillating signal has a repetitive periodic pattern.

18. The memory structure of claim 17, wherein a modification of the memory cells enables improved measurement of the write performance.

19. The memory structure of claim 17, further comprising another array of memory cells operating as data storage, wherein the performance monitor supports variable voltages applied to the data storage that allows for increased operating voltages for increased performance and power of the data storage or for lowered operating voltages for reduced performance and power of the data storage.

20. The memory structure of claim 17, wherein the sequence of at least one of the wordlines and the bitlines provides for at least one of a predetermined read order of bits and a predetermined write order of bits through the array of memory cells.

21. The memory structure of claim 20, wherein the at least one of the predetermined read order of bits and the predetermined write order of bits allow for fabrication of the memory structure independent of the at least one of a row decoder and a column decoder.

22. The memory structure of claim 17, wherein at least two of the wordlines are coupled together or at least two of the bitlines are coupled together so as to provide an averaging of the frequency of the output oscillating signal due to multiple memory cells being activated during a same time period, and wherein the averaging of the frequency reduces the impact of random memory cell to memory cell variation and correlate more to an average memory cell performance.

23. The memory structure of claim 17, wherein a measurement of the frequency of the output oscillating signal includes a measurement of jitter that refers to a variation from cycle to cycle of a period of the frequency, and wherein the variation correlates with a memory cell performance on a fine level, and wherein the variation correlates to a performance variation of the memory cell performance from memory cell to memory cell.

* * * * *